United States Patent
Kim et al.

(10) Patent No.: US 11,348,848 B2
(45) Date of Patent: May 31, 2022

(54) SEMICONDUCTOR DIE, SEMICONDUCTOR WAFER, SEMICONDUCTOR DEVICE INCLUDING THE SEMICONDUCTOR DIE AND METHOD OF MANUFACTURING THE SEMICONDUCTOR DEVICE

(71) Applicant: Samsung Electronics Co., Ltd., Suwon-si (KR)

(72) Inventors: Taehyo Kim, Daegu (KR); Chanho Kim, Seoul (KR); Daeseok Byeon, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 117 days.

(21) Appl. No.: 17/006,186

(22) Filed: Aug. 28, 2020

(65) Prior Publication Data

US 2021/0066145 A1 Mar. 4, 2021

Related U.S. Application Data

(63) Continuation-in-part of application No. 16/827,746, filed on Mar. 24, 2020, now Pat. No. 11,227,815.

(30) Foreign Application Priority Data

Aug. 30, 2019 (KR) .................. 10-2019-0107496

(51) Int. Cl.
*H01L 27/11573* (2017.01)
*H01L 21/66* (2006.01)
*H01L 23/00* (2006.01)

(52) U.S. Cl.
CPC .............. *H01L 22/34* (2013.01); *H01L 24/05* (2013.01); *H01L 27/11573* (2013.01); *H01L 2924/1443* (2013.01)

(58) Field of Classification Search
CPC ..... H01L 22/34; H01L 24/05; H01L 27/11573
See application file for complete search history.

(56) References Cited

U.S. PATENT DOCUMENTS 7,005,748 B2  2/2006  Kim et al.
7,292,050 B1  11/2007  Chow et al.
(Continued)

FOREIGN PATENT DOCUMENTS

CN    108511419 A    9/2018
JP    5098417 B2    12/2012

*Primary Examiner* — Dale E Page
*Assistant Examiner* — Wilner Jean Baptiste
(74) *Attorney, Agent, or Firm* — Muir Patent Law, PLLC

(57) ABSTRACT

A nonvolatile memory device includes a memory cell region including first pads and a peripheral circuit region including second pads. The regions comprises switches that are electrically connected with the pads, respectively, a test signal generator that generates test signals and to transmit the test signals to the switches, internal circuits that receive first signals through the pads and the switches, to perform operations based on the first signals, and to output second signals through the switches and the pads based on a result of the operations, and a switch controller that controls the switches so that the pads communicate with the test signal generator during a test operation and that the pads communicate with the internal circuits after a completion of the test operation. The peripheral circuit region is vertically connected to the memory cell region by the first metal pads and the second metal pads directly.

20 Claims, 21 Drawing Sheets

(56) References Cited

U.S. PATENT DOCUMENTS

| | | | |
|---|---|---|---|
| 7,619,312 | B2 | 11/2009 | Krishnamoorthy et al. |
| 7,679,133 | B2 | 3/2010 | Son et al. |
| 8,004,289 | B2 | 8/2011 | Dalton et al. |
| 8,426,980 | B2 | 4/2013 | Su et al. |
| 8,553,466 | B2 | 10/2013 | Han et al. |
| 8,559,235 | B2 | 10/2013 | Yoon et al. |
| 8,569,899 | B2 | 10/2013 | Zhang et al. |
| 8,654,587 | B2 | 2/2014 | Yoon et al. |
| 8,816,707 | B2 | 8/2014 | Lee et al. |
| 8,921,976 | B2 | 12/2014 | Zhang et al. |
| 9,105,517 | B2 | 8/2015 | Farooq et al. |
| 9,471,215 | B2 | 10/2016 | Wang et al. |
| 9,671,215 | B2 | 6/2017 | Farooq et al. |
| 9,852,988 | B2 | 12/2017 | Enquist et al. |
| 10,629,575 | B1 * | 4/2020 | Scharf ..................... H01L 24/20 |
| 10,790,296 | B1 * | 9/2020 | Yamaha ................... H01L 24/74 |
| 2011/0233648 | A1 | 9/2011 | Seol et al. |

* cited by examiner

FIG. 9
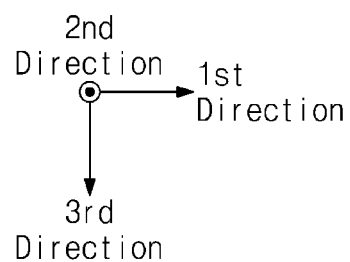
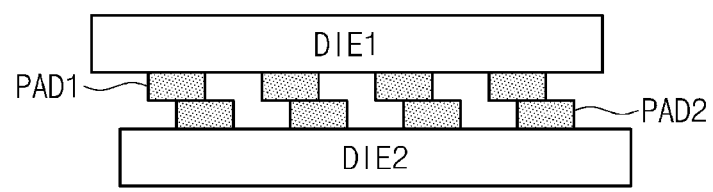
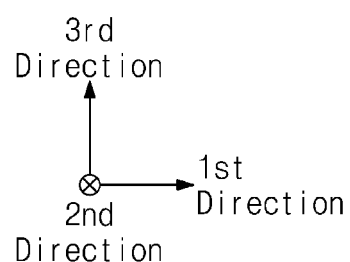

FIG. 11
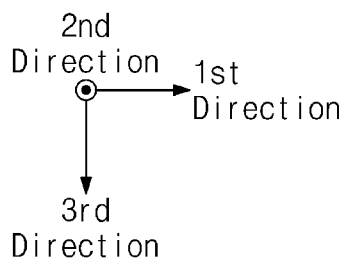
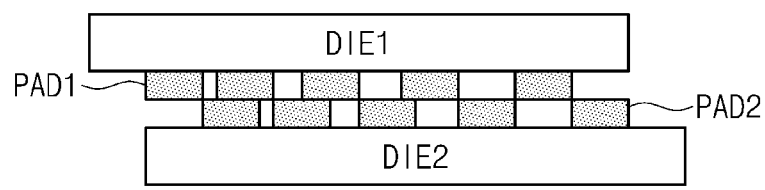
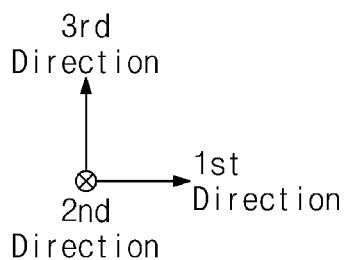

FIG. 12
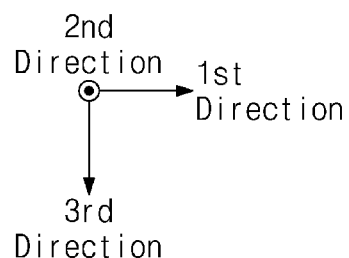
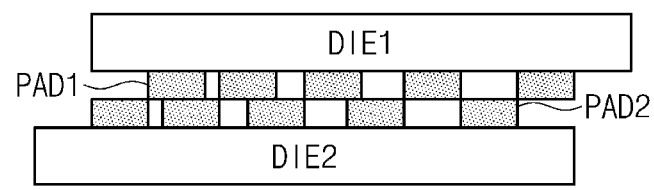
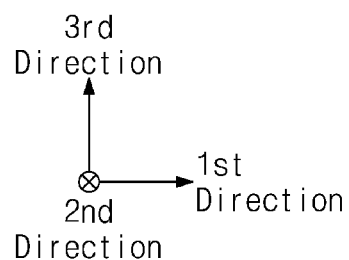

FIG. 17
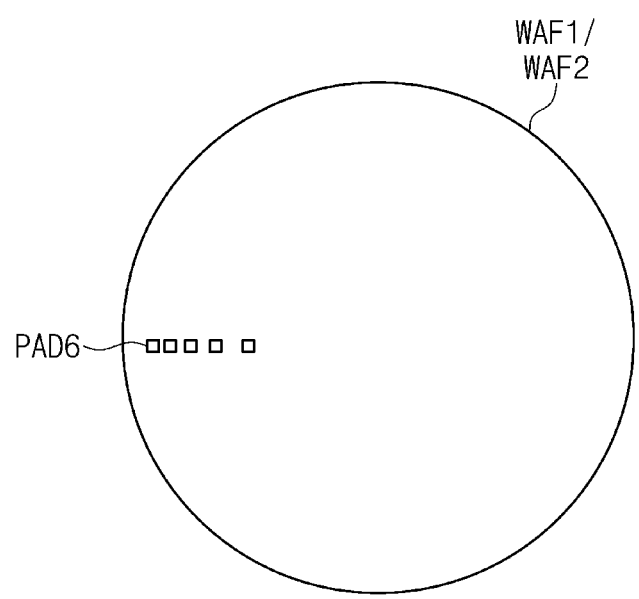
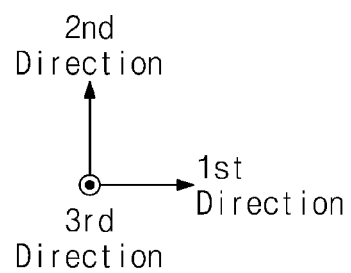

SEMICONDUCTOR DIE, SEMICONDUCTOR WAFER, SEMICONDUCTOR DEVICE INCLUDING THE SEMICONDUCTOR DIE AND METHOD OF MANUFACTURING THE SEMICONDUCTOR DEVICE

CROSS-REFERENCE TO RELATED APPLICATIONS

This U.S. non-provisional patent application is a continuation-in-part application of U.S. non-provisional patent application Ser. No. 16/827,746 filed on Mar. 24, 2020, which claims priority under 35 U.S.C. § 119 to Korean Patent Application No. 10-2019-0107496 filed on Aug. 30, 2019, in the Korean Intellectual Property Office, the disclosures of which are incorporated by reference herein in their entireties.

BACKGROUND

Embodiments of the inventive concept described herein relate to a semiconductor device, and more particularly, relate to a semiconductor die easily coupled to another semiconductor die and a semiconductor wafer easily coupled to another semiconductor wafer and a method of manufacturing the semiconductor device.

With the advancement of semiconductor manufacturing technologies, various processes for manufacturing a semiconductor device are being developed. One of the various processes includes a process of coupling two or more semiconductor dies to implement one semiconductor device or coupling two or more semiconductor wafers to implement a plurality of semiconductor devices.

In the case of coupling two or more semiconductor dies or two or more semiconductor wafers, how to align the semiconductor dies or the semiconductor wafers may determine the yield. In the case where the semiconductor dies or the semiconductor wafers are not successfully aligned, the communication between the semiconductor dies or the semiconductor wafers may not be successfully performed.

In the case where the communication is not successfully performed, a semiconductor device or semiconductor devices implemented by the coupling may have a defect. This causes a decrease of the yield.

SUMMARY

Embodiments of the inventive concept provide a semiconductor die and a semiconductor wafer beneficial for easy coupling.

According to an exemplary embodiment, a nonvolatile memory device includes a memory cell region including first metal pads and a peripheral circuit region including second metal pads. Each of the memory cell region and/or the peripheral circuit region comprises switches electrically connected with corresponding ones of the first metal pads and/or the second metal pads respectively, a test signal generator configured to generate test signals and to transmit the test signals to the switches, internal circuits configured to receive first signals through the corresponding ones of the first metal pads and/or second metal pads and the switches, to perform operations based on the first signals, and to output second signals through the switches and the corresponding ones of the first metal pads and/or second metal pads based on a result of the operations, and a switch controller configured to control the switches so that the corresponding ones of the first metal pads and/or the second metal pads communicate with the test signal generator during a test operation and that the corresponding ones of the first metal pads and/or the second metal pads communicate with the internal circuits after a completion of the test operation. The peripheral circuit region is vertically connected to the memory cell region by the first metal pads and the second metal pads directly.

According to an exemplary embodiment, a nonvolatile memory device includes a memory cell region including first metal pads, and a peripheral circuit region including second metal pads. Each of the memory cell region and/or the peripheral circuit region comprises switches electrically connected with the corresponding ones of the first metal pads and/or the second metal pads, a test signal receiver configured to receive reception signals through the first pads and the switches, internal circuits configured to receive first signals through the corresponding ones of the first metal pads and/or the second metal pads and the switches, to perform operations based on the first signals, and to output second signals through the switches and the corresponding ones of the first metal pads and/or the second metal pads based on a result of the operations, and a switch controller configured to control the switches so that the corresponding ones of the first metal pads and/or the second metal pads communicate with the test signal receiver during a test operation and that the corresponding ones of the first metal pads and/or the second metal pads communicate with the internal circuits after a completion of the test operation. The peripheral circuit region is vertically connected to the memory cell region by the first metal pads and the second metal pads directly.

According to an exemplary embodiment, a nonvolatile memory wafer includes first pads disposed in line along a first direction, wherein intervals between the first pads gradually increase or decrease in the first direction, test signal devices electrically connected with at least a part of the first pads and configured to transmit or receive test signals through the at least the part of the first pads, and internal circuits, each of the internal circuits being one of a nonvolatile memory cell region or a peripheral circuit region configured to access the nonvolatile memory cell region. The peripheral circuit region is configured to be vertically connected to the memory cell region by at least another part of the first pads directly.

BRIEF DESCRIPTION OF THE FIGURES

The above and other objects and features of the inventive concept will become apparent by describing in detail exemplary embodiments thereof with reference to the accompanying drawings.

FIGS. 9 and 10 illustrate examples in which a first die and a second die each including pads disposed at regular intervals are misaligned.

FIGS. 11 and 12 illustrate examples in which a first die and a second die each including pads disposed at intervals increasing or decreasing in a particular direction are misaligned.

FIG. 17 illustrates an example in which sixth pads are disposed at intervals gradually increasing or decreasing at a level of a semiconductor wafer.

DETAILED DESCRIPTION

Below, embodiments of the inventive concept will be described in detail and clearly to such an extent that a person of ordinary skill in the art easily implements the inventive concept.

Figure 1:
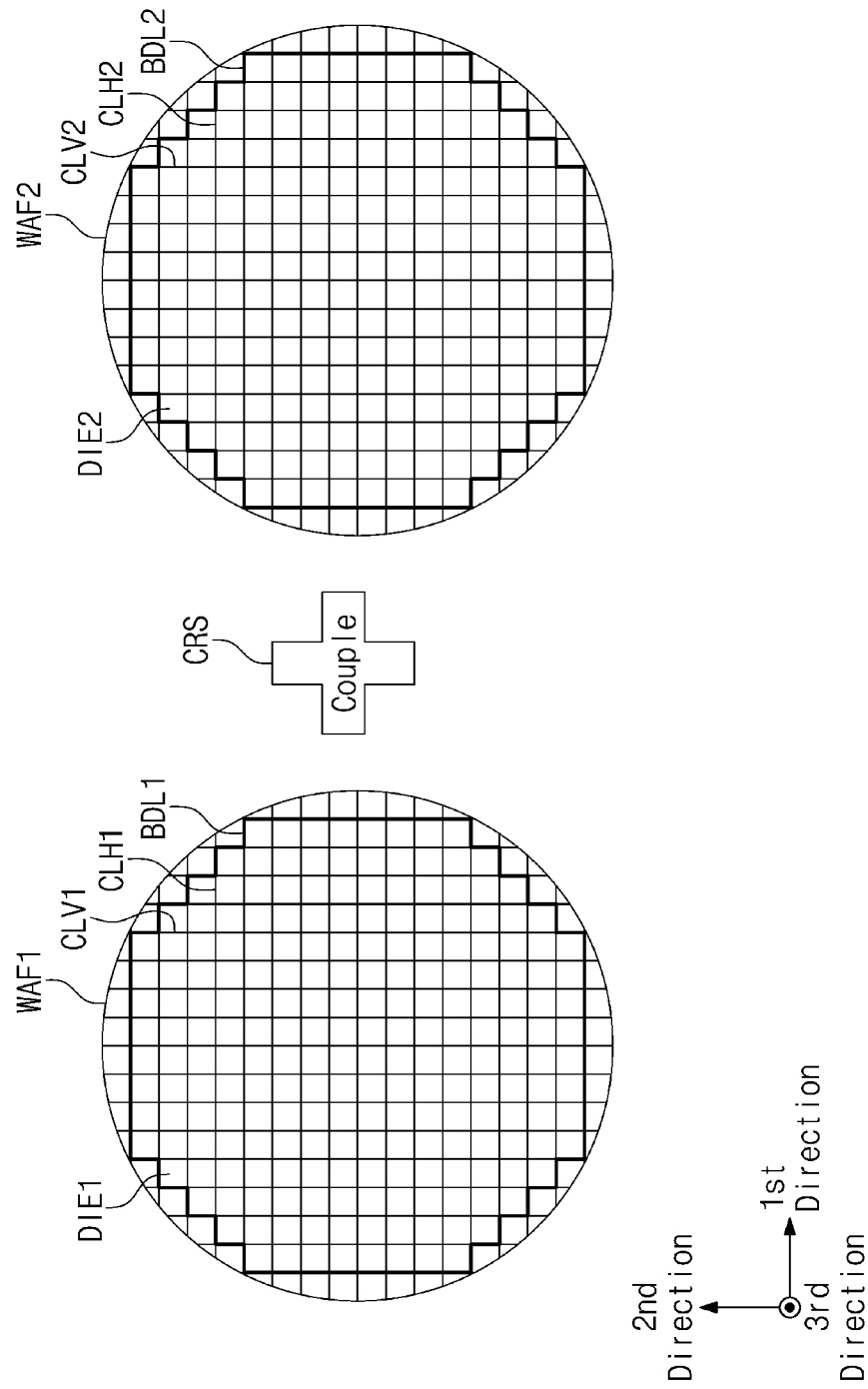
FIG. 1 illustrates a first semiconductor wafer and a second semiconductor wafer according to an embodiment of the inventive concept.

FIG. 1 illustrates a first semiconductor wafer WAF1 and a second semiconductor wafer WAF2 respectively having upper surfaces and lower surfaces extending in a first direction and second direction according to an embodiment of the inventive concept. Referring to FIG. 1, first semiconductor dies DIE1 may be manufactured on the first semiconductor wafer WAF1 by stacking a plurality of conductor layers and/or insulator layers to a third direction perpendicular to the first and second directions for the first semiconductor dies DIE1 to be placed within a first boundary line BDL1. The first semiconductor dies DIE1 may be separated from the first semiconductor wafer WAF1 by cutting the first semiconductor wafer WAF1 along a first horizontal cutting line CLH1 corresponding to the first direction and a first vertical cutting line CLV1 corresponding to the second direction. Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Second semiconductor dies DIE2 may be manufactured on the second semiconductor wafer WAF2 by stacking a plurality of conductor layers and/or insulator layers to the third direction for the second semiconductor dies DIE2 to be placed within a second boundary line BDL2. The second semiconductor dies DIE2 may be separated from the second semiconductor wafer WAF2 by cutting the second semiconductor wafer WAF2 along a second horizontal cutting line CLH2 corresponding to the first direction and a second vertical cutting line CLV2 corresponding to the second direction.

As illustrated by a cross CRS in FIG. 1, the first semiconductor wafer WAF1 and the second semiconductor wafer WAF2 may be coupled/combined to each other to implement a plurality of semiconductor devices (e.g., nonvolatile memory devices). A plurality of semiconductor devices in which the first semiconductor dies DIE1 and the second semiconductor dies DIE2 are coupled may be obtained by coupling the first semiconductor wafer WAF1 and the second semiconductor wafer WAF2 and cutting a result of the coupling, e.g., by cutting the combined product of the first and second semiconductor wafers WAF1 and WAF2.

Figure 2:
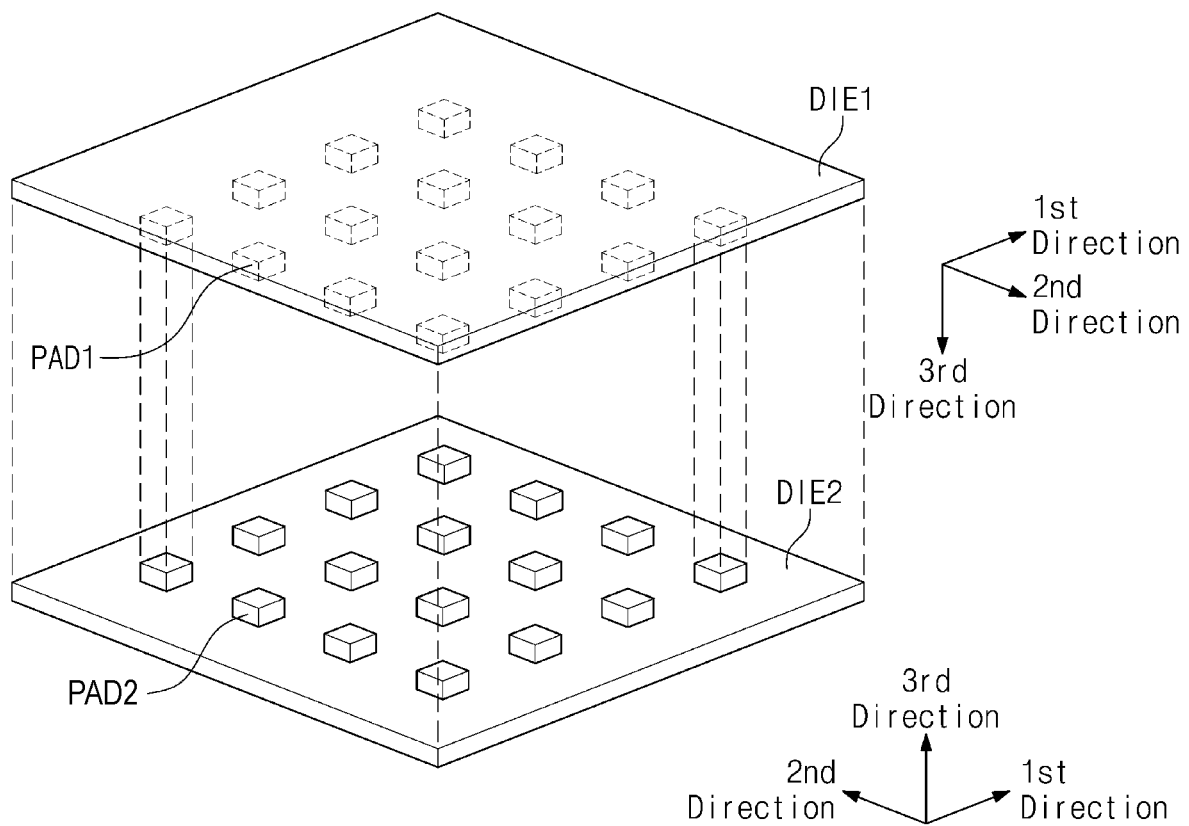
FIG. 2 illustrates an example in which one first die and one second die are coupled.

FIG. 2 illustrates an example in which one first die DIE1 and one second die DIE2 are coupled. Referring to FIGS. 1 and 2, for the coupling the first die DIE1 with the second die DIE2, the first die DIE1 may be rotated 180 degrees around the first direction. Accordingly, the coordinate system of the first die DIE1 and the coordinate system of the second die DIE2 are illustrated independently of each other.

The first die DIE1 may include first pads PAD1 disposed on an upper surface of the first die DIE1 in the third direction. The first pads PAD1 may be disposed along the first direction and the second direction at regular intervals. The first, second, and third directions may be perpendicular to one another.

The second die DIE2 may include second pads PAD2 disposed on an upper surface of the second die DIE2 of the third direction. The second pads PAD2 may be disposed along the first direction and the second direction at regular intervals.

When the first wafer WAF1 and the second wafer WAF2 are coupled, the first pads PAD1 of the first die DIE1 and the second pads PAD2 of the second die DIE2 are respectively coupled. When locations of the first pads PAD1 and locations of the second pads PAD2 are accurately aligned (e.g., are aligned within an allowable error range), the coupling may succeed. When the locations of the first pads PAD1 and the locations of the second pads PAD2 are not accurately aligned (e.g., are aligned out of an allowable error range), the coupling may fail.

A semiconductor die and a semiconductor wafer according to an embodiment of the inventive concept support a test operation for determining the accuracy of alignment. For example, the first and second semiconductor wafers WAF1 and WAF2 may be implemented with a circuit and/or patterns configured to test the accuracy of alignment. The semiconductor die and the semiconductor wafer may include pads that are used for the test operation. By performing the test operation, the semiconductor die and the semiconductor wafer according to an embodiment of the inventive concept may be aligned and coupled easily and accurately. For example, the test operation may be performed during the coupling of the first and second wafers WAF1 and WAF2 to accurately couple the first and second wafers WAF1 and WAF2.

Figure 3:
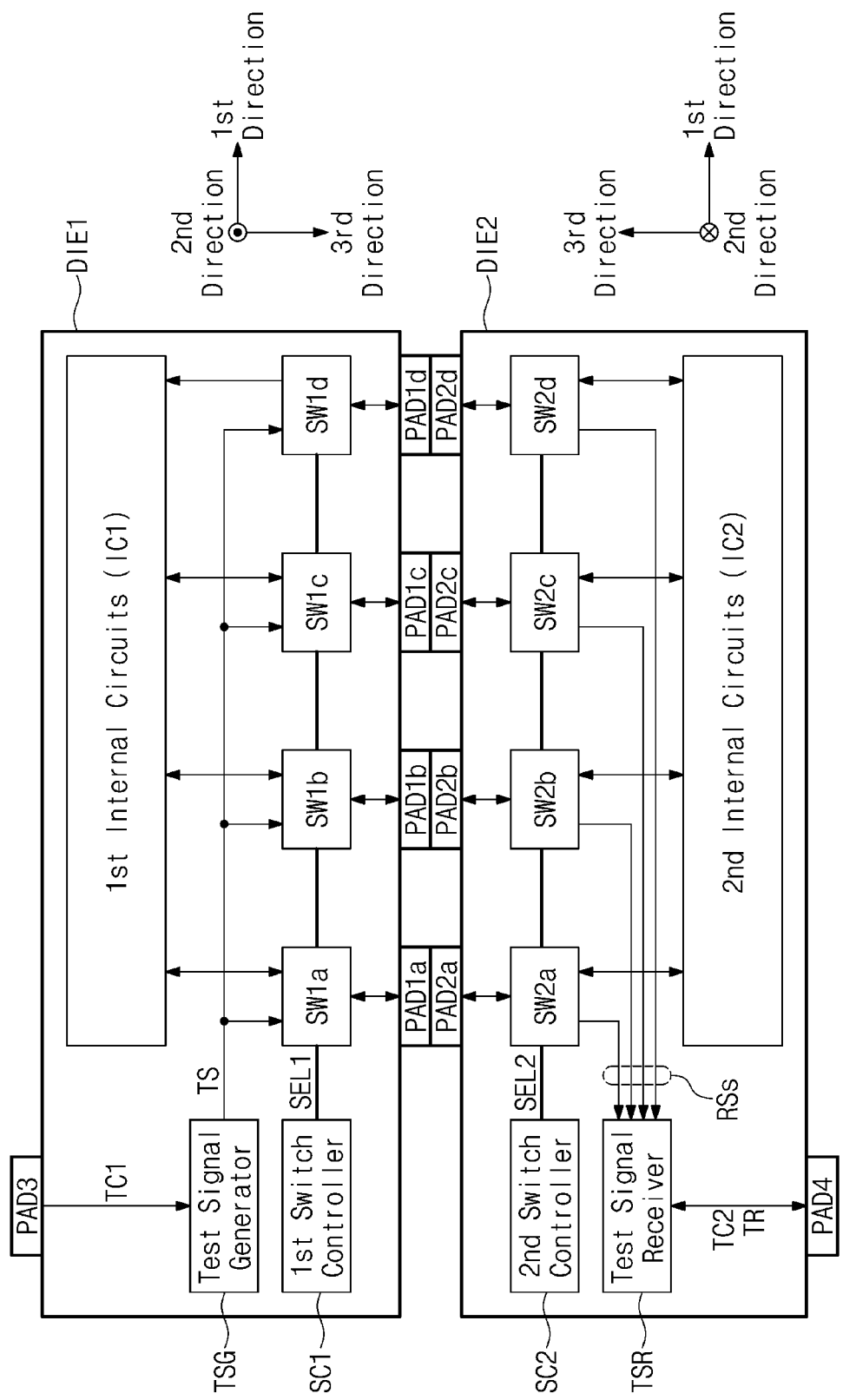
FIG. 3 illustrates examples of components of a first die and a second die.

FIG. 3 illustrates examples of components of the first die DIE1 and the second die DIE2. In FIG. 3, as an embodiment, there are illustrated certain components of the first die DIE1 and the second die DIE2 taken along a plane defined by the first direction and the third direction. For example, FIG. 3 illustrates a block diagram of certain components of the first and second dies DIE1 and DIE2, and some components (e.g., pads and dies) illustrated in FIG. 3 may correspond to a cross-sectional view. Referring to FIGS. 1 to 3, the first die DIE1 may include first internal circuits IC1, a test signal generator TSG, a first switch controller SC1, a plurality of first switches SW1a to SW1d, a plurality of first pads PAD1a to PAD1d, and a third pad PAD3.

The first internal circuits IC1 may include components for performing operations corresponding to a design purpose of the first die DIE1. For example, the first internal circuits IC1 may include a memory cell array 100 which will be described with reference to FIGS. 18 and 19 and/or a peripheral device 200 accessing the memory cell array 100 which will be described with reference to FIG. 20. The first internal circuits IC1 may be electrically connected to the first switches SW1a to SW1d.

The test signal generator TSG may receive a first test command TC1 from the third pad PAD3. In response to the first test command TC1, the test signal generator TSG may transmit a test signal TS to the first switches SW1a to SW1d. The first test command TC1 may be input to the third pad PAD3 from an external device disposed outside of the first die DIE1 and the second die DIE2. The third pad PAD3 may be disposed on a surface of the first die DIE1 opposite to a surface on which the first pads PAD1a to PAD1d coupled to the second die DIE2 are disposed. For example, the third pad PAD3 may be disposed on a lower surface of the first die DIE1. For example, the upper surface and the lower surface of the first die DIE1 may be flat surfaces extending parallel to each other.

The first switch controller SC1 may output a first selection signal SEL1 for controlling the first switches SW1a to SW1d. For example, in a test operation for alignment and coupling, the first switch controller SC1 may control the first switches SW1a to SW1d such that the first pads PAD1a to PAD1d communicate with the test signal generator TSG. For example, the first switch controller SC1 may control the first switches SW1a to SW1d to allow the first pads PAD1a to PAD1d to communicate with the test signal generator TSG sequentially. In certain embodiments, the first switch controller SC1 may control the first switches SW1a to SW1d to allow the first pads PAD1a to PAD1d to communicate with the test signal generator TSG simultaneously or randomly.

After the test operation is completed and the first die DIE1 is aligned with and/or coupled to the second die DIE2, the first switch controller SC1 may control the first switches SW1a to SW such that the first pads PAD1a to PAD1d communicate with the first internal circuits IC1. The first pads PAD1a to PAD1d may correspond to the first pads PAD1 of FIG. 2.

The second die DIE2 may include second internal circuits IC2, a test signal receiver TSR, a second switch controller SC2, a plurality of second switches SW2a to SW2d, a plurality of second pads PAD2a to PAD2d, and a fourth pad PAD4.

The second internal circuits IC2 may include components for performing operations corresponding to a design purpose of the second die DIE2. For example, the second internal circuits IC2 may include the memory cell array 100 which will be described with reference to FIGS. 18 and 19 or the peripheral device 200 accessing the memory cell array 100 which will be described with reference to FIG. 20. The second internal circuits IC2 may be electrically connected to the second switches SW2a to SW2d.

The test signal receiver TSR may receive a second test command TC2 from the fourth pad PAD4. In response to the second test command TC2, the test signal receiver TSR may receive reception signals RSs from the second switches SW2a to SW2d. The second test command TC2 may be input to the fourth pad PAD4 from the external device disposed outside of the first die DIE1 and the second die DIE2. The fourth pad PAD4 may be disposed on a surface of the second die DIE2 opposite to a surface on which the second pads PAD2a to PAD2d coupled to the first die DIE1 are disposed. For example, the fourth pad PAD4 may be disposed on a lower surface of the second die DIE2. For example, the upper surface and the lower surface of the second die DIE2 may be flat surfaces extending parallel to each other.

When the reception signals RSs are received in response to the second test command TC2, the test signal receiver TSR may output the reception signals RSs to an external device through the fourth pad PAD4 after or without processing the reception signals RSs.

The second switch controller SC2 may output a second selection signal SEL2 for controlling the second switches SW2a to SW2d. For example, in the test operation for alignment and coupling, the second switch controller SC2 may control the second switches SW2a to SW2d such that the second pads PAD2a to PAD2d communicate with the test signal receiver TSR.

After the test operation is completed and the second die DIE2 is aligned with and/or coupled to the first die DIE1, the second switch controller SC2 may control the second switches SW2a to SW2d such that the second pads PAD2a to PAD2d communicate with the second internal circuits IC2. The second pads PAD2a to PAD2d may correspond to the second pads PAD2 of FIG. 2.

In some embodiments, one or more of the first and second dies DIE1 and DIE2 may be formed as a controller. When one of the first die DIE1 and the second die DIE2 is implemented as a controller, the die corresponding to the controller may include additional pads for communicating with an external host device (e.g., a controller to control a nonvolatile memory device) in addition to the pads illustrated in FIG. 3. In certain embodiments, the additional pads may be disposed on a surface on which the third pad PAD3 or the fourth pad PAD4 is disposed.

In some embodiments, in the test operation, the die implemented as the controller from among the first die DIE1 and the second die DIE2 may receive a power through a pad(s), which is designated to receive the power from the external host device, from among the additional pads described above. The die implemented as the controller may supply the received power to another die.

For another example, in the test operation, each of the first die DIE1 and the second die DIE2 may further include an additional pad configured to receive a power for the test operation. In this case, the power for the test operation may not be supplied to the first internal circuits IC1 and the second internal circuits IC2. The additional pad may be disposed on a surface on which the third pad PAD3 or the fourth pad PAD4 is disposed.

In some embodiments, the third pad PAD3, the fourth pad PAD4, or the additional pad for receiving the power for the test operation may be used for another purpose after the test operation is completed. For example, the third pad PAD3, the fourth pad PAD4, or the additional pad may be configured to exchange signals with the external host device or a debug device.

In this case, like the first switch controller SC1 and the first switches SW1a to SW1d or like the second switch controller SC2 and the second switches SW2a to SW2d, switching elements may be added that electrically connect the third pad PAD3, the fourth pad PAD4, or the extra pad to the first internal circuits IC1 or the second internal circuits IC2 after the completion of the test operation.

Figure 4:
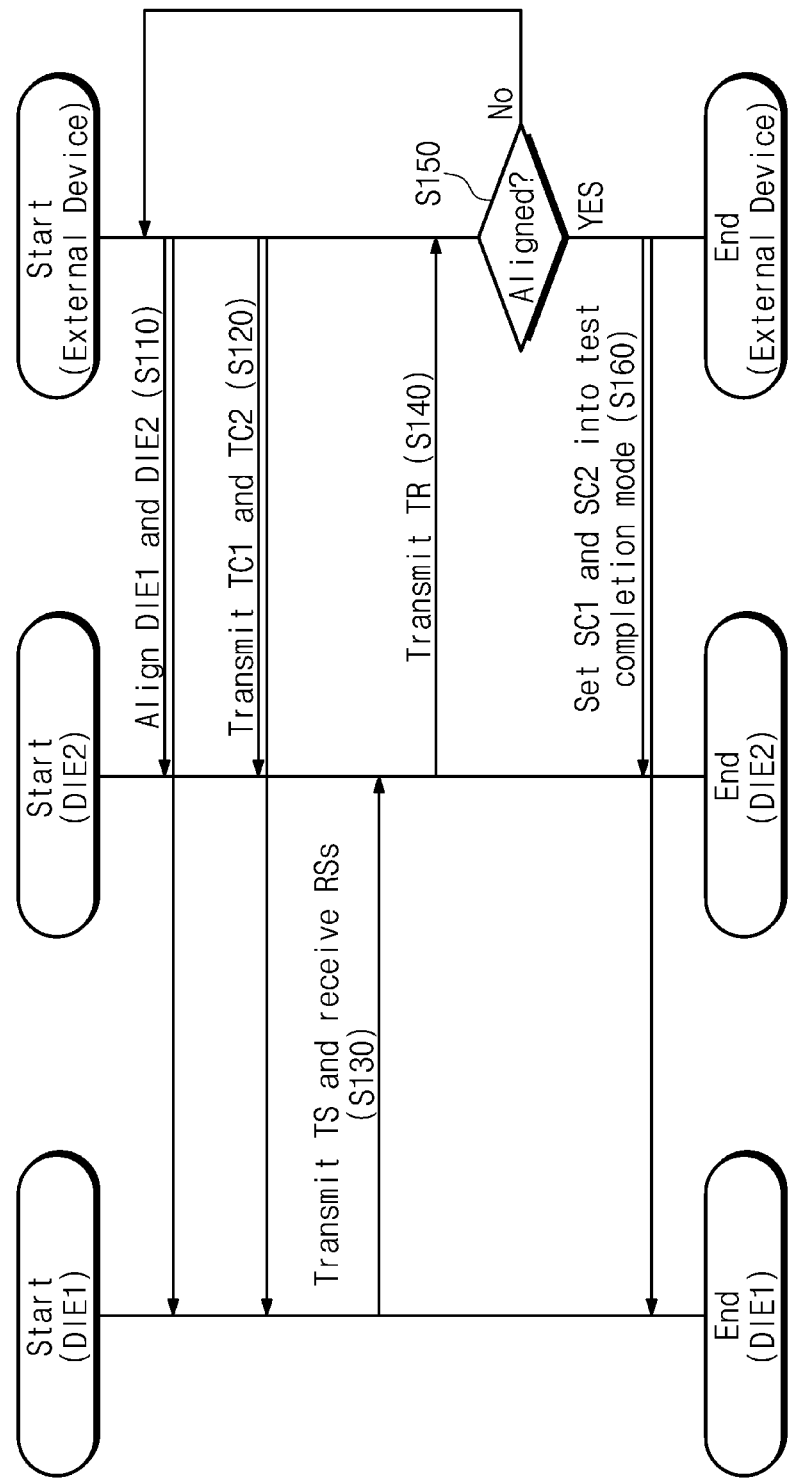
FIG. 4 illustrates an exemplary procedure of a test operation of aligning a first die with a second die.

FIG. 4 illustrates an exemplary procedure of a test operation of aligning the first die DIE1 with the second die DIE2. An external device, for example, a test device or an alignment and coupling device may take the lead in an alignment and test operation.

Referring to FIGS. 3 and 4, in operation S110, the external device may align the first die DIE1 with the second die DIE2. In operation S120, the external device may transmit the first test command TC1 to the first die DIE1 and may transmit the second test command TC2 to the second die DIE2.

In operation S130, the first die DIE1 may transmit the test signal TS through the first switches SW1a to SW1d and the first pads PAD1a to PAD1d in response to the first test command TC1. The second die DIE2 may receive the reception signals RSs through the second pads PAD2a to PAD2d and the second switches SW2a to SW2d in response to the second test command TC2. For example, in view of the second die DIE2, the reception signals may start to vary in response to receiving (or transmitting) the first test command TC1.

In operation S140, the second die DIE2 may output the reception signals RSs to the external device as a test result TR after or without processing the reception signals RSs. In operation S150, the external device may determine whether the first die DIE1 and the second die DIE2 are accurately aligned (e.g., within an allowable error range).

In an embodiment, the first die DIE1 may transmit a voltage of a particular level or a current of a particular amount as the test signal TS. When the first pads PAD1a to PAD1d are accurately aligned with the second pads PAD2a to PAD2d, voltages of the same particular level (or a level decreased within an allowable error) or currents of the same particular amount (or an amount decreased within the allowable error) may be received as the reception signals RSs.

When the first pads PAD1a to PAD1d are not accurately aligned with the second pads PAD2a to PAD2d, voltages of a level smaller than the particular level (or a level decreased to such an extent as to be out of the allowable error) or currents of an amount smaller than the particular amount (or an amount decreased to such an extent as to be out of the allowable error) may be received as the reception signals RSs.

The external device may determine whether the first die DIE1 and the second die DIE2 are accurately aligned (e.g., within the allowable error range), by comparing voltage levels or current amounts of the reception signals RSs with an expected value (e.g., the particular level or the particular amount described above).

When the first die DIE1 and the second die DIE2 are not accurately aligned, the external device may again align the first die DIE1 with the second die DIE2 in operation S110. For example, the external device may calculate an alignment error based on differences between the voltage levels or current amounts of the reception signals RSs and the expected value and may again align the first die DIE1 with the second die DIE2 depending on the calculated alignment error.

The external device may repeat operation S110 to operation S150 until the first die DIE1 and the second die DIE2 are accurately aligned. When it is determined that the first die DIE1 and the second die DIE2 are accurately aligned, in operation S160, the external device may set the first switch controller SC1 and the second switch controller SC2 to a test completion mode.

For example, the external device may notify the first switch controller SC1 and the second switch controller SC2 that the test operation is completed, by transmitting test completion commands to the third pad PAD3 and the fourth pad PAD4.

As another example, each of the first switch controller SC1 and the second switch controller SC2 may include a laser fuse. The external device may set the first switch controller SC1 and the second switch controller SC2 to the test completion mode by cutting the laser fuse. For example, the laser fuse may be a conductor pattern/wire that is designed to be cut/separated by exposing to a laser beam to be an open circuit.

As another example, each of the first switch controller SC1 and the second switch controller SC2 may include an electrical fuse. The external device may set the first switch controller SC1 and the second switch controller SC2 to the test completion mode, by changing states of electrical fuses through a means of controlling the electrical fuses of the first die DIE1 and the second die DIE2. For example, the electrical fuse may be a conductor pattern/wire that is designed to be cut/separated, or a storage element which storing a logic value (e.g., a resistance value) being changed, by flowing a predetermined electrical current through the electrical fuse for the electrical fuse to be an open circuit.

Before or after operation S160, an operation of coupling the first die DIE1 and the second die DIE2 may be performed after accurately aligning the first die DIE1 with the second die DIE2. For example, the external device may couple the first die DIE1 and the second die DIE2 by respectively bonding the first pads PAD1a to PAD1d and the second pads PAD2a to PAD2d.

Figure 5:
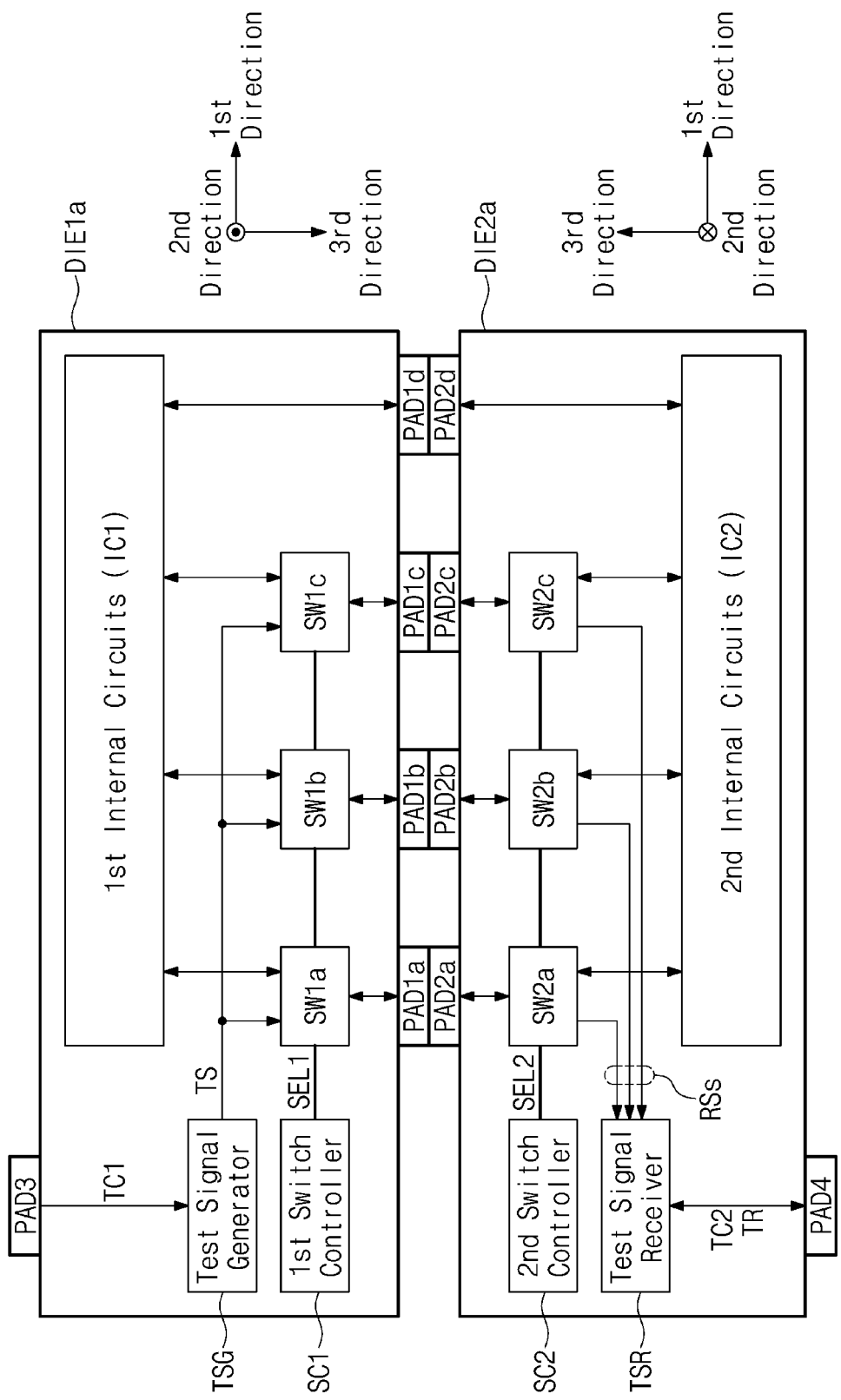
FIG. 5 illustrates some examples of components of a first die and a second die.

FIG. 5 illustrates some examples of components of a first die DIE1a and a second die DIE2a. In FIG. 5, as an embodiment, there are illustrated certain components of the first die DIE1a and the second die DIE2a taken along a plane defined by the first direction and the third direction. For example, FIG. 5 illustrates a block diagram of certain components of the first and second dies DIE1 and DIE2, and some components (e.g., pads and dies) illustrated in FIG. 5 may correspond to a cross-sectional view. Compared to the first die DIE1 of FIG. 3, in the first die DIE1a of FIG. 5, the first pad PAD1d may be directly connected to the first internal circuits IC1. For example, there may be no intervening component between the first pad PAD1d and the first internal circuits IC1 except a conductor pattern electrically connecting the first pad PAD1d and the first internal circuits IC1.

Also, compared to the second die DIE2 of FIG. 3, in the second die DIE2a of FIG. 5, the second pad PAD2d may be directly connected to the second internal circuits IC2. For example, there may be no intervening component between the second pad PAD2d and the second internal circuits IC2 except a conductor pattern electrically connecting the second pad PAD2d and the second internal circuits IC2. For example, one or more pads that are connected to internal circuits may be used for an alignment test operation, and the other pads may not be used for the alignment test operation.

The first die DIE1a and the second die DIE2a of FIG. 5 are identical to the first die DIE1 and the second die DIE2 of FIG. 3 except that the first pad PAD1d is directly connected to the first internal circuits IC1 and the second pad PAD2d is directly connected to the second internal circuits IC2. Thus, additional description will be omitted to avoid redundancy. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Figure 6:
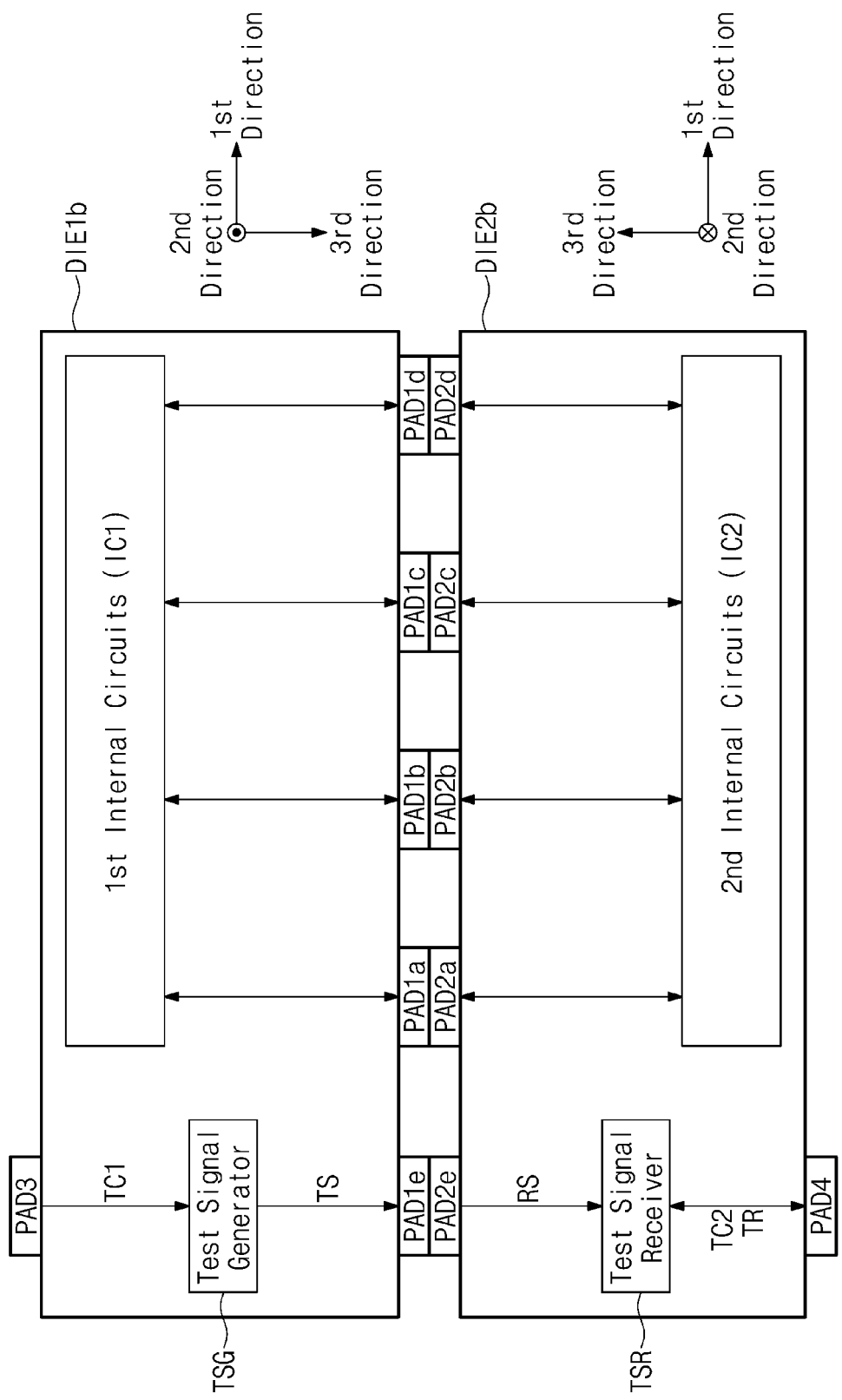
FIG. 6 illustrates some examples of components of a first die and a second die.

FIG. 6 illustrates some examples of components of a first die DIE1b and a second die DIE2b. In FIG. 6, as an embodiment, there are illustrated components of the first die DIE1b and the second die DIE2b taken along a plane defined by the first direction and the third direction. For example, FIG. 6 illustrates a block diagram of certain components of the first and second dies DIE1 and DIE2, and some components (e.g., pads and dies) illustrated in FIG. 6 may correspond to a cross-sectional view. Compared to the first die DIE1 of FIG. 3, in the first die DIE1b of FIG. 6, the first pads PAD1a to PAD1d may be directly connected to the first internal circuits IC1. For example, there may be no intervening component between the first pads PAD1a to PAD1d and the first internal circuits IC1 except corresponding conductor patterns electrically connecting the first pads PAD1a to PAD1d and the first internal circuits IC1.

The first die DIE1b may further include an additional first pad PAD1e that is used for the test operation. The test signal generator TSG of the first die DIE1b may receive the first test command TC1 from the third pad PAD3 and may transmit the test signal TS to the additional first pad PAD1e in response to the first test command TC1.

Compared to the second die DIE2 of FIG. 3, in the second die DIE2a of FIG. 6, the second pads PAD2a to PAD2d may be directly connected to the second internal circuits IC2. For example, there may be no intervening components connected between the second pads PAD2a to PAD2d and the second internal circuits IC2 except a conductor pattern electrically connecting the second pads PAD2a to PAD2d and the second internal circuits IC2. The second die DIE2b may further include an additional second pad PAD2e that is used for the test operation.

The test signal receiver TSR of the second die DIE2b may receive the second test command TC2 from the fourth pad PAD4 and may receive a reception signal RS from the additional second pad PAD2e in response to the second test command TC2. The test signal receiver TSR may output a test result TR through the fourth pad PAD4.

FIG. 6 illustrates one first pad PAD1e and one second pad PAD2e used for the test operation. However, for the test operation, two or more pads may be used for each die. Also, a pad that is designated to receive a power for the test operation may be added to the first die DIE1b or the second die DIE2b.

Figure 7:
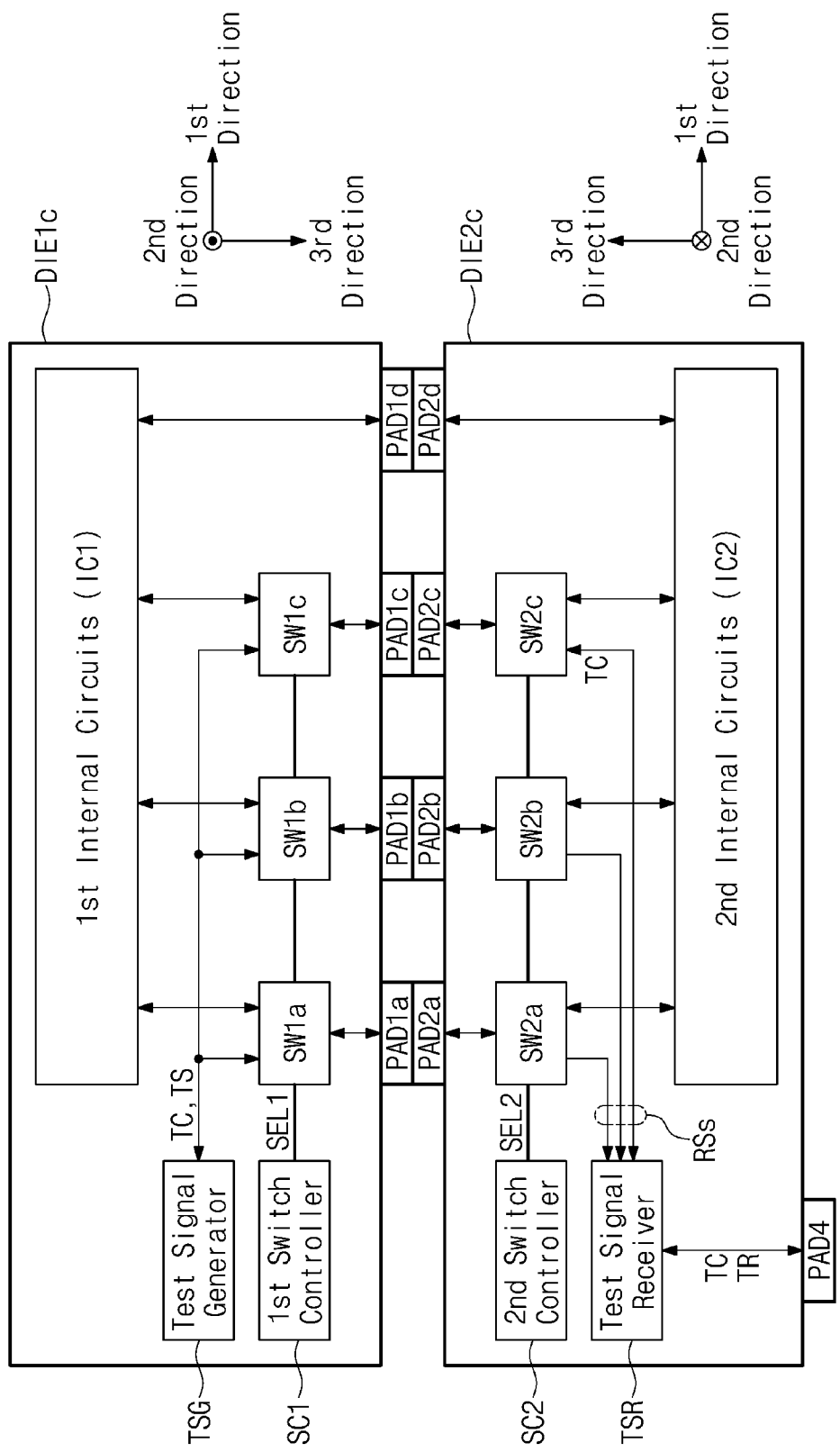
FIG. 7 illustrates some examples of components of a first die and a second die.

FIG. 7 illustrates some examples of components of a first die DIE1c and a second die DIE2c. In FIG. 7, as an embodiment, there are illustrated components of the first die DIE1c and the second die DIE2c taken along a plane defined by the first direction and the third direction. For example, FIG. 7 illustrates a block diagram of certain components of the first and second dies DIE1 and DIE2, and some components (e.g., pads and dies) illustrated in FIG. 7 may correspond to a cross-sectional view. Compared to the first die DIE1a of FIG. 5, the first die DIE1c of FIG. 7 may not include the third pad PAD3 illustrated in FIG. 5. The test signal generator TSG may receive a test command TC through at least one pad of the first pads PAD1a to PAD1d and at least one switch (e.g., SW1c) corresponding to the at least one pad from among the first switches SW1a to SW1c.

Compared to the second die DIE2a of FIG. 5, the test signal receiver TSR of the second die DIE2c of FIG. 7 may receive the test command TC through the fourth pad PAD4. The test signal receiver TSR may transmit the test command TC to the first die DIE1c through a switch (e.g., SW2c), which corresponds to the at least one pad of the first die DIE1c described above, from among the second switches SW2a to SW2c, and a pad, which corresponds to the at least one pad of the first die DIE1c described above, from among the second pads PAD2a to PAD2d.

In an embodiment, the second die DIE2c may receive a power for the test operation through the fourth pad PAD4, through another pad designated to receive the power for the test operation, or through pads for communicating with an external host device. For example, the second die DIE2c may include additional pads designated to receive power signal from and/or to communicate with an external device, e.g., the external host device. The second die DIE2c may supply the first die DIE1c with the power received from the external device for the test operation through at least one of the second pads PAD2a to PAD2d, or through a pad designated to a power supply (in the test operation or even after the test operation is completed).

In an embodiment, as described with reference to FIG. 3, the first die DIE1c and the second die DIE2c may be modified such that all pads connected with internal circuits are used for the test operation.

Figure 8:
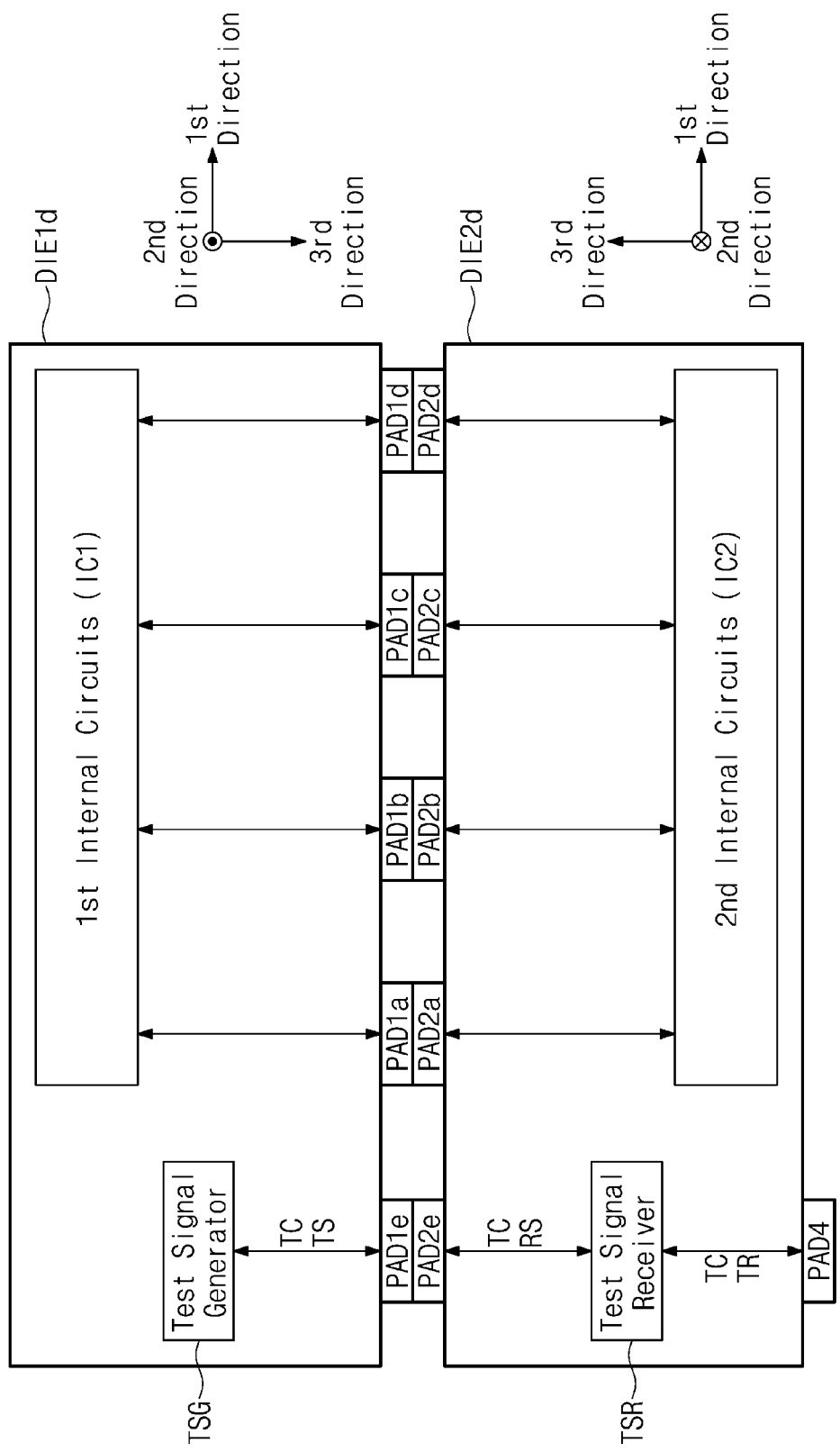
FIG. 8 illustrates some examples of components of a first die and a second die.

FIG. 8 illustrates some examples of components of a first die DIE1d and a second die DIE2d. In FIG. 8, as an embodiment, there are illustrated components of the first die DIE1d and the second die DIE2d taken along a plane defined by the first direction and the third direction. For example, FIG. 8 illustrates a block diagram of certain components of the first and second dies DIE1 and DIE2, and some components (e.g., pads and dies) illustrated in FIG. 8 may correspond to a cross-sectional view. Compared to the first die DIE1b of FIG. 6, the first die DIE1d of FIG. 8 may not include the third pad PAD3 illustrated in FIG. 6. The test signal generator TSG may receive the test command TC through the first pad PAD1e.

Compared to the second die DIE2b of FIG. 6, the test signal receiver TSR of the second die DIE2d of FIG. 8 may receive the test command TC through the fourth pad PAD4. The test signal receiver TSR may transmit the test command TC to the first die DIE1d through the second pad PAD2e.

In an embodiment, the second die DIE2d may receive a power for the test operation through the fourth pad PAD4, through another pad designated to receive the power for the test operation, or through pads for communicating with an external host device. For example, the second die DIE2d may include additional pads designated to receive power signal from and/or to communicate with an external device, e.g., the external host device. The second die DIE2d may supply the first die DIE1d with the power received from the external device for the test operation through a pad designated to a power supply (in the test operation or even after the test operation is completed).

Figure 10:
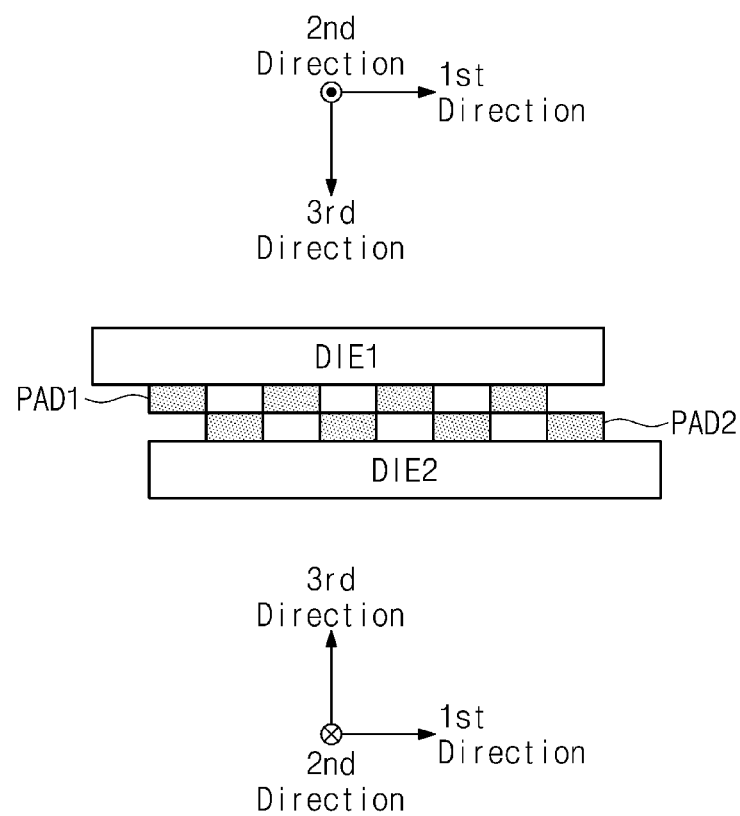

FIGS. 9 and 10 illustrate examples in which the first die DIE1 and the second die DIE2 each including pads disposed at regular intervals are misaligned. As illustrated in FIG. 9, in the case where the first pads PAD1 of the first die DIE1 and the second pads PAD2 of the second die DIE2 are misaligned, a level or an amount of each of the reception signals RSs (refer to FIGS. 3 and 5 to 8) received at the second die DIE2 may be smaller than the expected value. However, it may not be indicated which direction the first die DIE1 and the second die DIE2 are misaligned.

As illustrated in FIG. 10, in the case where the first pads PAD1 of the first die DIE1 and the second pads PAD2 of the second die DIE2 are misaligned, information of misalignment may not be obtained. For example, a misalignment direction may not be detected. In certain cases, a misalignment distance may not be detected. Accordingly, when again aligning the first die DIE1 with the second die DIE2 (when proceeding from operation S150 to operation S110 in FIG. 4), the external device may repeatedly perform alignment in consideration of all cases with regard to a misaligned direction. This causes a decrease in the speed of alignment and coupling. For example, lack of misalignment information may delay and/or complicate realignment processes.

FIGS. 11 and 12 illustrate examples in which the first die DIE1 and the second die DIE2 each including pads disposed at intervals increasing or decreasing in a particular direction are misaligned. As illustrated in FIGS. 11 and 12, intervals of the first pads PAD1 of the first die DIE1 may gradually increase along the first direction. Intervals of the second pads PAD2 of the second die DIE2 may gradually increase along the first direction.

As illustrated in FIG. 11, the second die DIE2 may shift with respect to the first die DIE1 along the first direction. In this case, the first pads PAD1 are respectively connected to pads placed adjacent in the first direction from pads designed to be connected among the second pads PAD2. The remaining pads of the first and second pads PAD1 and PAD2 may not be connected to each other.

As illustrated in FIG. 12, the first die DIE1 may shift with respect to the second die DIE2 along the first direction. In this case, some of the first pads PAD1 may be connected to some of the second pads PAD2 as shown in FIG. 12. The other first and second pads PAD1 and PAD2 may not be connected to each other. For example, when widths of the first and second pads PAD1 and PAD2 are smaller than distances between pads, some of the first and second pads PAD1 and PAD2 may not be connected to each other.

In the case where the first pads PAD1 and the second pads PAD2 are disposed at intervals gradually increasing or decreasing along a particular direction, the reception signals RSs may be received through different pads depending on a direction in which the first die DIE1 and the second die DIE2 are misaligned. Accordingly, direction information for realignment may be obtained from the reception signals RSs, and alignment may be easily corrected and coupling may be efficiently performed.

The external device may store a direction of misalignment and realignment distances corresponding to levels or amounts of the reception signals RSs in a table. A test device or an alignment and coupling device may obtain a direction and a distance of misalignment and may align and couple semiconductor dies and semiconductor wafers with reference to the table.

As described with reference to FIG. 10, to prevent the first pads PAD1 and the second pads PAD2 from being completely separated from each other, an interval between at least two closest pads from among the first pads PAD1 may be smaller than a width of each of the first pads PAD1. Likewise, an interval between at least two closest pads, which correspond to the at least two pads described above, from among the second pads PAD2 may be smaller than a width of each of the second pads PAD2.

Figure 13:
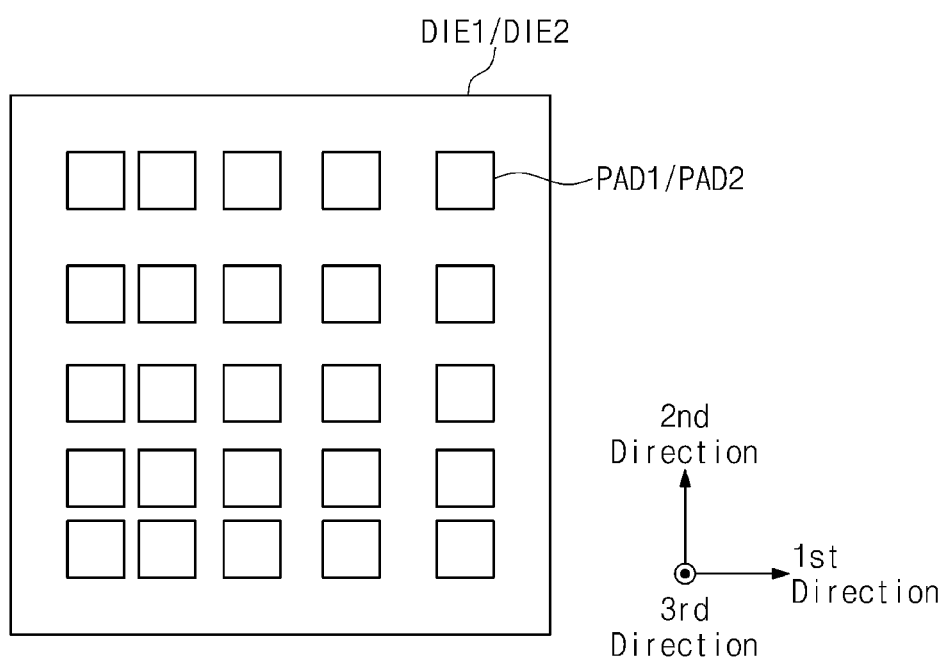
FIG. 13 illustrates an example in which pads of a semiconductor die are disposed at intervals gradually increasing or decreasing on a two-dimensional plane.

FIG. 13 illustrates an example in which pads of a semiconductor die DIE1/DIE2 are disposed at intervals gradually increasing or decreasing on a two-dimensional plane. Referring to FIG. 13, first and second pads PAD1/PAD2 may be disposed at intervals that gradually increase along the first direction. Also, the first and second pads PAD1/PAD2 may be disposed at intervals that gradually increase along the second direction.

When the first and second pads PAD1/PAD2 are disposed as illustrated in FIG. 13, the external device may obtain realignment direction and distance that are expressed in the form of vectors on the coordinate system of the first direction and the second direction. For example, the external device may calculate a misalignment direction and a misalignment distance on the basis of signals transferred through the first and second pads PAD1 and PAD2 and received by the test signal receiver TSR in combination with the position information of the first pads PAD1 and/or the second pads PAD2 respectively. For example, the position information of the first pads PAD1 and/or the second pads PAD2 may be coordinate values of the first pads PAD1 and the second pads PAD2.

Figure 14:
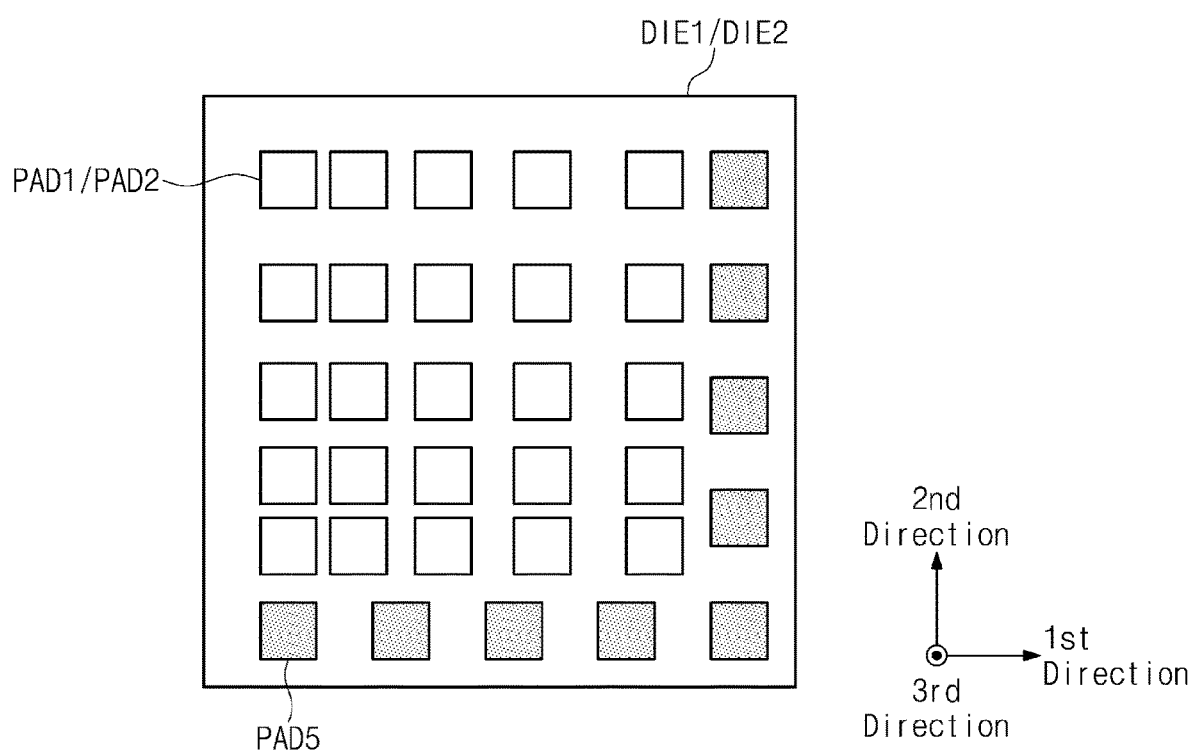
FIG. 14 illustrates an example in which some pads of a semiconductor die are disposed at intervals gradually increasing or decreasing on a two-dimensional plane and the remaining pads of the semiconductor die are disposed at regular intervals.

FIG. 14 illustrates an example in which some pads (e.g., first and second pads PAD1/PAD2) of a semiconductor die DIE1/DIE2 are disposed at intervals gradually increasing or decreasing on a two-dimensional plane and the remaining pads (e.g., fifth pads PAD5) of the semiconductor die DIE1/DIE2 are disposed at regular intervals.

For example, levels or amounts of reception signals transferred through the fifth pads PAD5 disposed at regular intervals may be used for the external device to determine a distance of realignment. For example, the accuracy of the distance of realignment may be improved by combining levels or amounts of reception signals transferred through the first and second pads PAD1/PAD2 and the fifth pads PAD5. For example, the first and second pads PAD1 and PAD2 may be used in the same manner as or a similar manner to the first and second pads PAD1 and PAD2 explained in FIG. 13.

Figure 15:
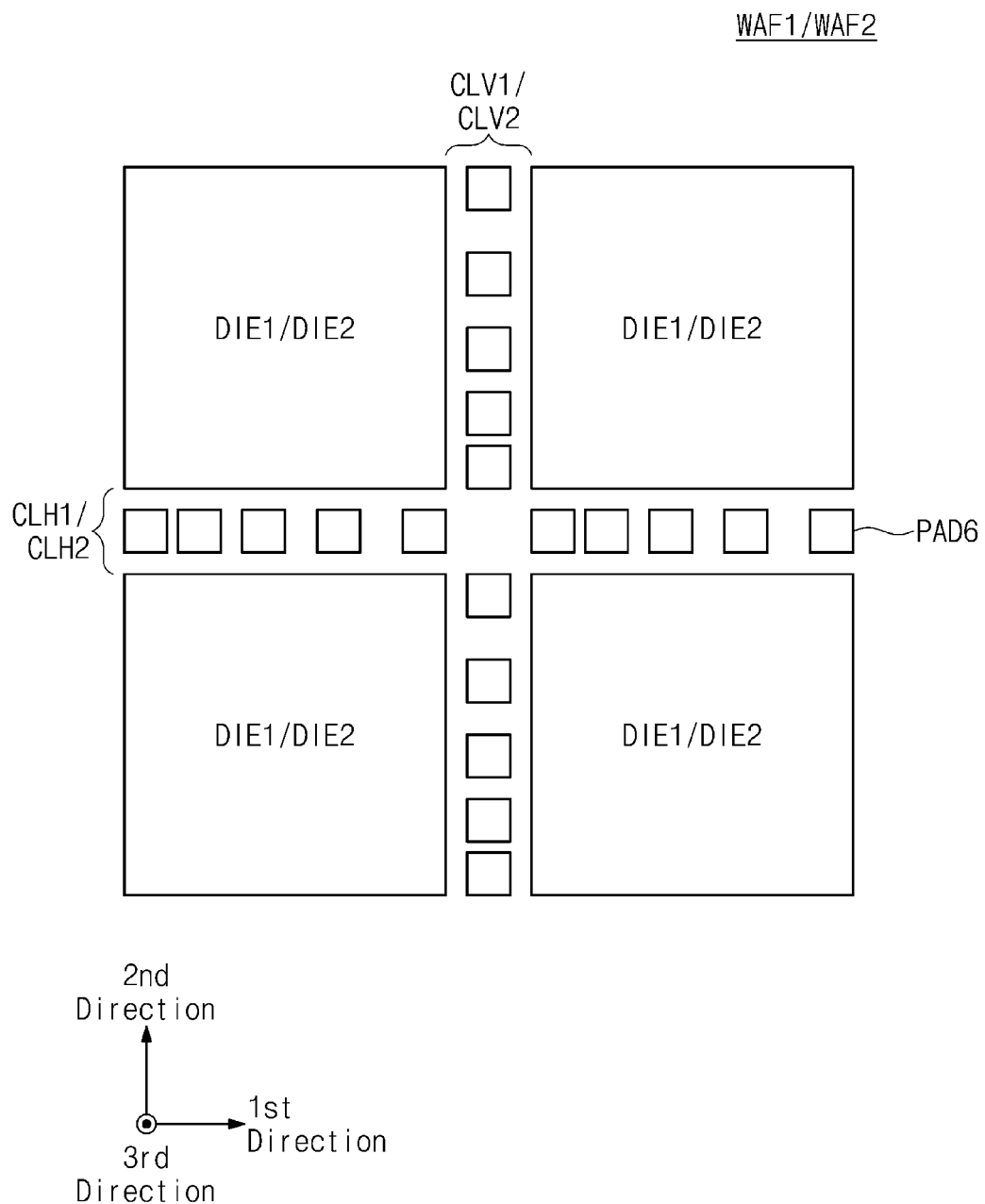
FIG. 15 illustrates an example in which sixth pads for a test operation are disposed on horizontal cutting lines and vertical cutting lines of a semiconductor wafer.

FIG. 15 illustrates an example in which sixth pads PAD6 for a test operation are disposed on horizontal cutting lines CLH1/CLH2 and vertical cutting lines CLV1/CLV2 of a semiconductor wafers WAF1/WAF2. For example, cutting lines described herein may include certain widths. For example, a cutting line may include an elongating area between semiconductor dies arranged parallel in a direction. For example, the cutting line may be an elongated area along which a cutting/dicing process is performed so that the semiconductor dies are separated from each other. Referring to FIG. 15, the sixth pads PAD6 may be disposed between adjacent semiconductor dies DIE1/DIE2 such that intervals between the sixth pads PAD6 gradually increase along the first direction and gradually increase along the second direction.

The sixth pads PAD6 may be implemented to be independent of the semiconductor dies DIE1/DIE2. In an embodiment, the sixth pads PAD6 may correspond to the first pad PAD1e or the second pad PAD2e of FIG. 6 or may correspond to the first pad PAD1e or the second pad PAD2e of FIG. 8. For example, the sixth pads PAD6 may perform a similar function to or the same function as the first pads PAD1e and/or the second pads PAD2e of FIGS. 6 and 8. For example, components for a test operation, which correspond to the sixth pads PAD6, may be implemented on the horizontal cutting lines CLH1/CLH2 and the vertical cutting lines CLV1/CLV2. For example, the sixth pads PAD6 and its related components (e.g., cooperating components) may be formed on the horizontal cutting lines CLH1/CLH2 and the vertical cutting lines CLV1/CLV2 as shown in FIG. 15.

In the process of separating the semiconductor dies DIE1/DIE2 from a wafer and/or from each other, the horizontal cutting lines CLH1/CLH2 and the vertical cutting lines CLV1/CLV2 may be removed by the dicing process. Accordingly, the sixth pads PAD6 for the test operation and the corresponding components may also be removed by the dicing process. For example, some or all components associated with the test operation may not remain in the separated semiconductor dies DIE1/DIE2.

Figure 16:
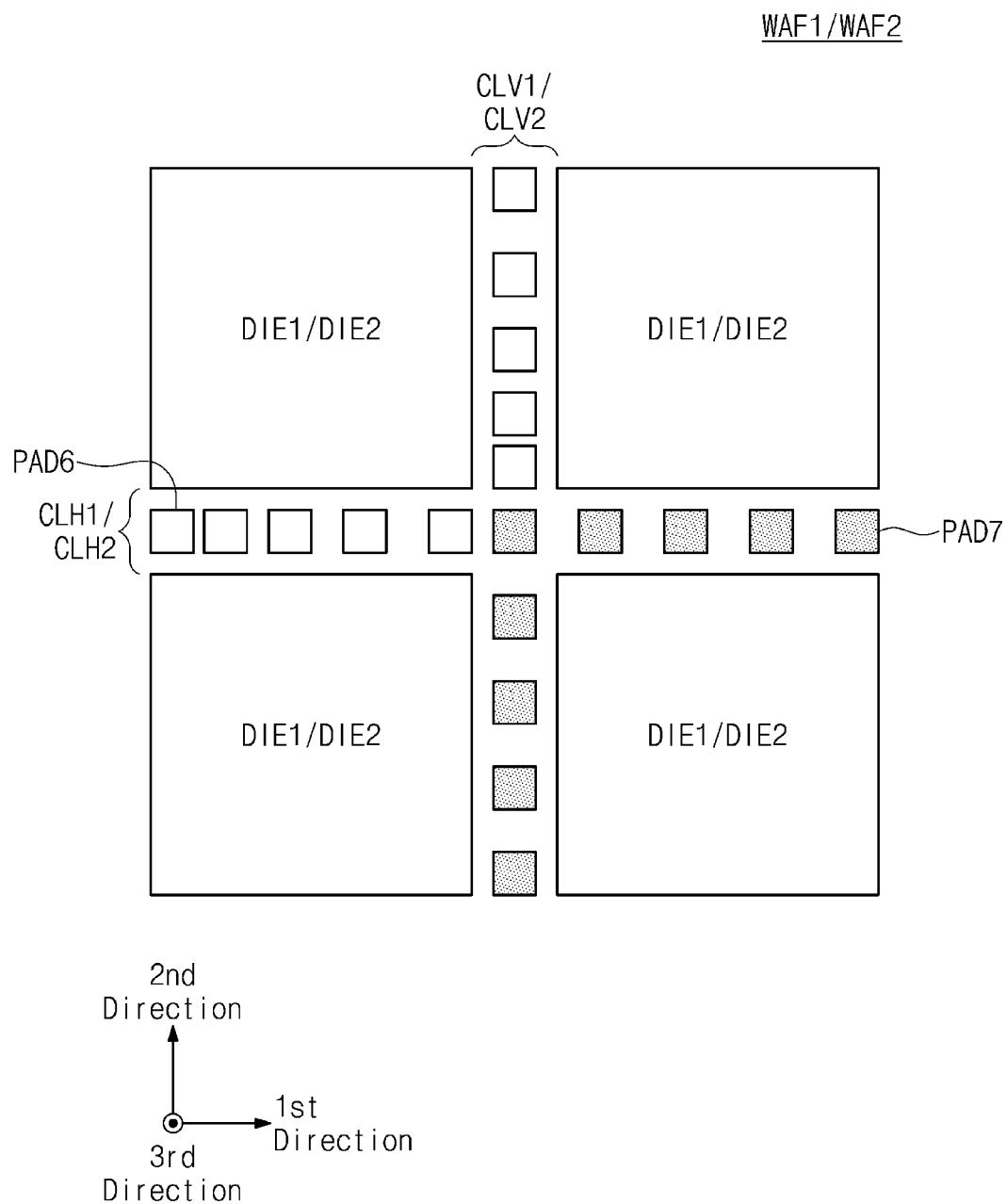
FIG. 16 illustrates an example in which sixth pads and seventh pads for a test operation are disposed on horizontal cutting lines and vertical cutting lines of a semiconductor wafer.

FIG. 16 illustrates an example in which the sixth pads PAD6 and seventh pads PAD7 for a test operation are disposed on the horizontal cutting lines CLH1/CLH2 and the vertical cutting lines CLV1/CLV2 of the semiconductor wafers WAF1/WAF2. Referring to FIG. 16, the sixth pads PAD6 may be disposed between adjacent semiconductor dies DIE1/DIE2 such that intervals between the sixth pads PAD6 gradually increase along the first direction and gradually increase along the second direction. The seventh pads PAD7 may be disposed at regular intervals along the first direction and the second direction. For example, the sixth pads PAD6 in FIGS. 15 and 16 may be used for a test operation similarly to the first pads PAD1 and/or the second pads PAD2 described with respect to FIGS. 13 and 14, and the seventh pads PAD7 may be used for a test operation similarly to the fifth pads PAD5 described with respect to FIG. 14.

In examples illustrated in FIGS. 15 and 16, the sixth pads PAD6 are disposed on the horizontal cutting lines CLH1/CLH2 and the vertical cutting lines CLV1/CLV2 between the four semiconductor dies DIE1/DIE2 adjacent to each other such that intervals between the sixth pads PAD6 gradually increases or decreases. In certain embodiments, the sixth pads PAD6 may be disposed at intervals gradually increasing or decreasing within a larger range.

FIG. 17 illustrates an example in which the sixth pads PAD6 are disposed at intervals gradually increasing or decreasing at a level of the semiconductor wafers WAF1/WAF2. Referring to FIG. 17, the sixth pads PAD6 may be disposed in an area of specific/certain semiconductor dies of the semiconductor wafers WAF1/WAF2. For example, the sixth pads PAD6 of FIG. 17 may be disposed on certain semiconductor dies or between certain semiconductor dies as described in the previous embodiments.

As described with reference to FIG. 13, the sixth pads PAD6 may be disposed at intervals gradually increasing or decreasing in the second direction on the semiconductor wafers WAF1/WAF2, as well as the first direction thereon. As described with reference to FIG. 15, the sixth pads PAD6 may be repeatedly disposed in two or more areas on the semiconductor wafers WAF1/WAF2.

As described with reference to FIG. 16, the seventh pads PAD7 may be disposed in an area of specific/certain semiconductor dies of the semiconductor wafers WAF1/WAF2 at regular intervals. The seventh pads PAD7 may be repeatedly disposed in two or more areas on the semiconductor wafers WAF1/WAF2.

Figure 18:
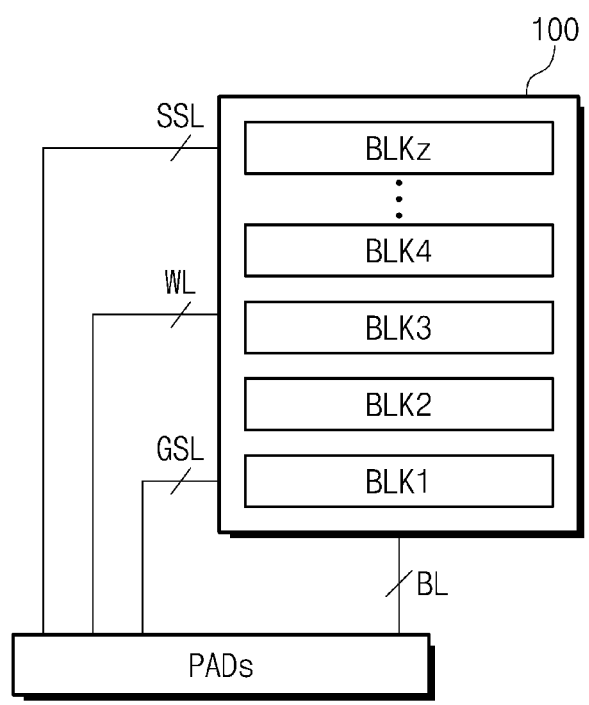
FIG. 18 is a block diagram illustrating a memory cell array capable of being implemented with one of first internal circuits and second internal circuits of FIG. 3.

FIG. 18 is a block diagram illustrating the memory cell array 100 capable of being implemented with one of the first internal circuits IC1 and the second internal circuits IC2 of FIG. 3. Referring to FIG. 18, the memory cell array 100 includes a plurality of memory blocks BLK1 to BLKz.

Each of the memory blocks BLK1 to BLKz may include a plurality of memory cells. Each of the memory blocks BLK1 to BLKz may be connected to at least one ground selection line GSL, word lines WL, and at least one string selection line SSL. Some of the word lines WL may be used as dummy word lines. Each of the memory blocks BLK1 to BLKz may be connected to a plurality of bit lines BL. The plurality of memory blocks BLK1 to BLKz may be connected in common to the plurality of bit lines BL.

In an embodiment, each of the plurality of memory blocks BLK1 to BLKz may correspond to a unit of an erase operation of information stored in the memory blocks BLK1 to BLKz. For example, the information stored in the memory cells belonging to each memory block may be erased at the same time. In certain embodiments, each of the plurality of memory blocks BLK1 to BLKz may include a plurality of sub-blocks. Each of the plurality of sub-blocks may correspond to a unit of an erase operation of information stored in the plurality of the sub-blocks. For example, the information stored in the memory cells of each sub-block may be erased at the same time.

The string selection lines SSL, the word lines WL, the ground selection lines GSL, and the bit lines BL may be connected with another semiconductor die through pads PADs. For example, all or a part of the string selection lines SSL, the word lines WL, the ground selection lines GSL, and the bit lines BL may be connected through switches or directly to the pads PADs as described with reference to FIGS. 3 and 5 to 8.

Figure 19:
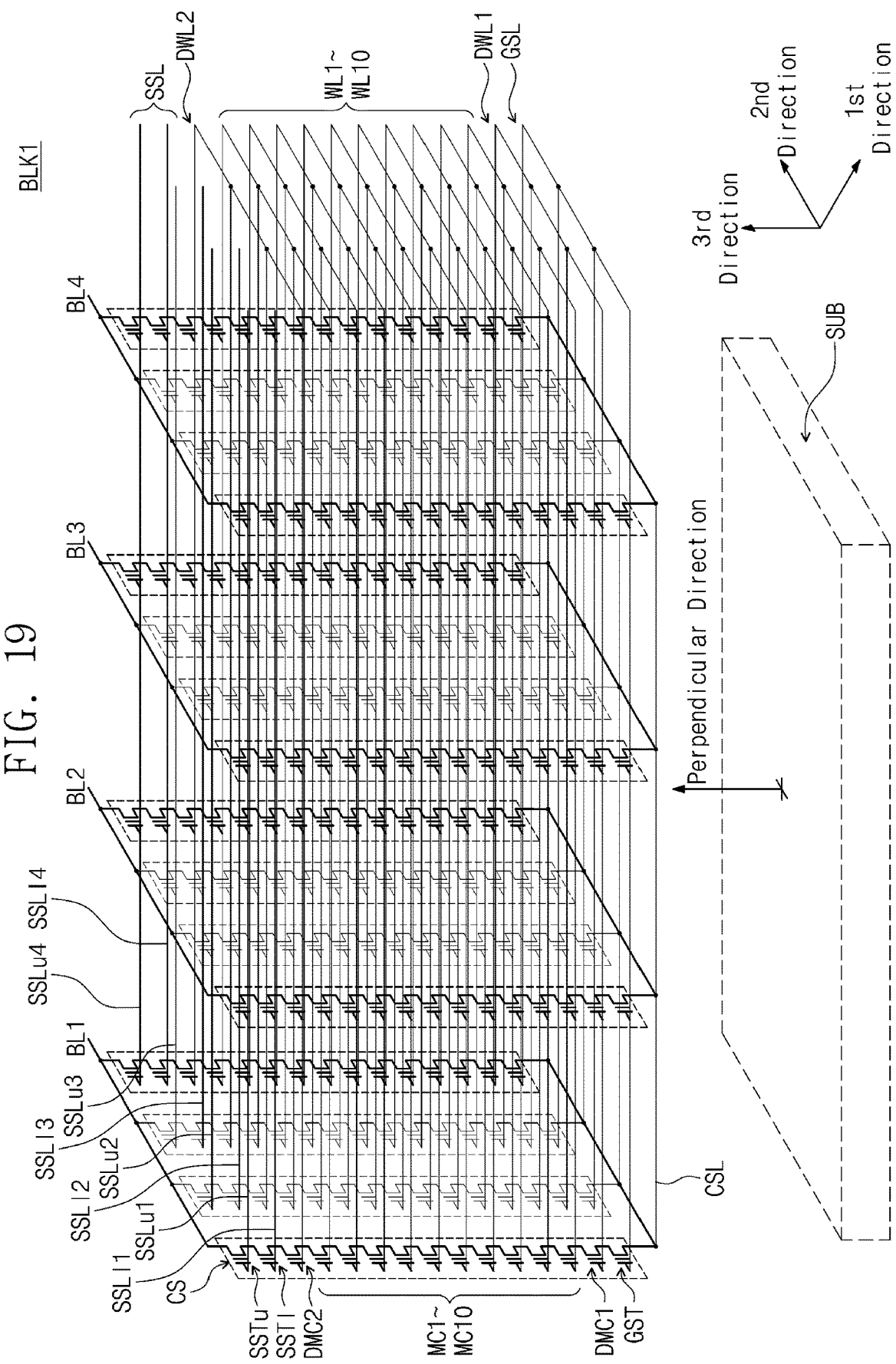
FIG. 19 is a circuit diagram illustrating an example of one memory block of memory blocks of FIG. 18.

FIG. 19 is a circuit diagram of an example of one memory block BLK1 of the memory blocks BLK1 to BLKz of FIG. 18. Referring to FIG. 19, a plurality of cell strings CS may be arranged in rows and columns on a substrate SUB in a first direction, a second direction, and a third direction. The plurality of cell strings CS may be connected in common to a common source line CSL formed on (or in) the substrate SUB. In FIG. 19, a location of the substrate SUB and its disposed direction are illustrated to help understand a structure of the memory block BLK1.

Cell strings of the rows may be connected in common to the ground selection line GSL, and cell strings of each row may be connected to a corresponding one of first to fourth upper string selection lines SSLu1 to SSLu4 and a corresponding one of first to fourth lower string selection lines SSLl1 to SSLl4. Cell strings of each column may be connected to a corresponding one of first to fourth bit lines BL1 to BL4. For a simple and clear illustration, cell strings connected to the second and third string selection lines SSL2l, SSL2u, SSL3l, and SSL3u are depicted with thin lines.

Each cell string may include at least one ground selection transistor GST connected to the ground selection line GSL, a first dummy memory cell DMC1 connected to a first dummy word line DWL1, first to tenth memory cells MC1 to MC10 respectively connected to first to tenth word lines WL1 to WL10, a second dummy memory cell DMC2 connected to a second dummy word line DWL2, and lower and upper string selection transistors SSTl and SSTu respectively connected to the corresponding lower and upper string selection lines.

In each cell string, the ground selection transistor GST, the first dummy memory cell DMC1, the first to tenth memory cells MC1 to MC10, the second dummy memory cell DMC2, and the lower and upper string selection transistors SSTl and SSTu may be serially connected along a third direction perpendicular to the substrate SUB and may be sequentially stacked along the third direction perpendicular to the substrate SUB.

The memory block BLK1 may be provided as a 3D memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. As used herein, the term "monolithic" means that layers of each level of the array are directly deposited on the layers of each underlying level of the 3D memory array.

In an embodiment of the inventive concept, the 3D memory array includes vertical cell strings CS (or NAND strings) that are vertically oriented such that at least one memory cell is located over another memory cell. The at least one memory cell may comprise a charge trap layer. Each cell string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 20:
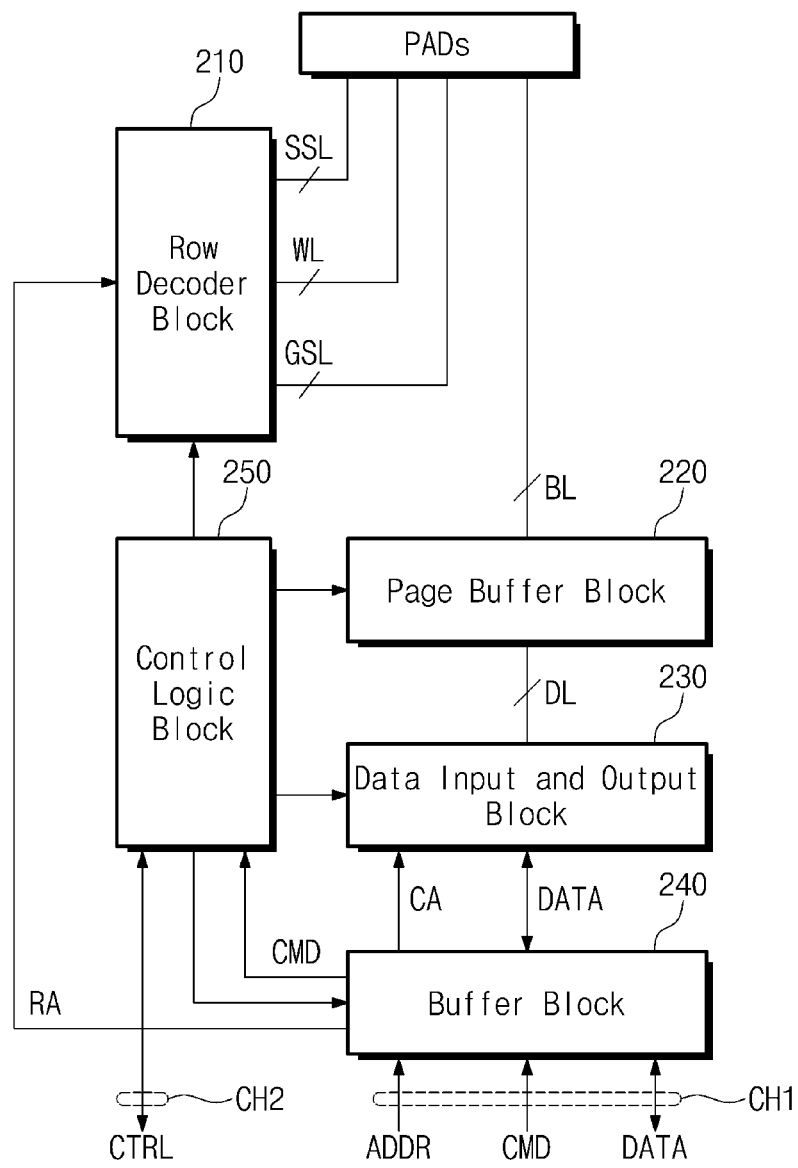
FIG. 20 is a block diagram illustrating a peripheral device capable of being implemented with one of first internal circuits and second internal circuits of FIG. 3.

FIG. 20 is a block diagram illustrating the peripheral device 200 capable of being implemented with one of the first internal circuits IC1 and the second internal circuits IC2 of FIG. 3. Referring to FIG. 20, the peripheral device 200 may include a row decoder block 210, a page buffer block 220, a data input and output block 230, a buffer block 240, and a control logic block 250.

The row decoder block 210 may be connected to the ground selection lines GSL, the word lines WL, and the string selection lines SSL. The row decoder block 210 may operate under control of the control logic block 250.

The row decoder block 210 may decode a row address RA received from the buffer block 240 and may control voltages to be applied to the string selection lines SSL, the word lines WL, and the ground selection lines GSL based on the decoded row address.

The page buffer block 220 may be connected to the plurality of bit lines BL. The page buffer block 220 may be connected with the data input and output block 230 through a plurality of data lines DL. The page buffer block 220 may operate under control of the control logic block 250.

In a write operation, the page buffer block 220 may store data to be written. The page buffer block 220 may apply voltages to the plurality of bit lines BL based on the stored data. In a read operation or in a verify read operation that is performed in the write operation or an erase operation, the page buffer block 220 may sense voltages of the bit lines BL and may store the sensing result.

The data input and output block 230 may be connected with the page buffer block 220 through the plurality of data lines DL. The data input and output block 230 may receive a column address CA from the buffer block 240. The data input and output block 230 may output data read by the page buffer block 220 to the buffer block 240 depending on the column address CA. The data input and output block 230 may provide data received from the buffer block 240 to the page buffer block 220, based on the column address CA.

The buffer block 240 may receive a command CMD and an address ADDR from an external device through a first channel CH1 and may exchange data "DATA" with the external device. The buffer block 240 may operate under control of the control logic block 250. The buffer block 240 may transmit the command CMD to the control logic block 250. The buffer block 240 may transmit the row address RA of the address ADDR to the row decoder block 210 and may transmit the column address CA of the address ADDR to the data input and output block 230. The buffer block 240 may exchange the data "DATA" with the data input and output block 230.

The control logic block 250 may exchange a control signal CTRL from the external device through a second channel CH2. The control logic block 250 may allow the buffer block 240 to route the command CMD, the address ADDR, and the data "DATA".

The control logic block 250 may decode the command CMD received from the buffer block 240 and may control the peripheral device 200 depending on the decoded command. For example, the control logic block 250 may specify an order of program operations, in which the row decoder block 210 and the page buffer block 220 program memory cells, based on differences of structures and distinct characteristics of the memory cells.

The string selection lines SSL, the word lines WL, the ground selection lines GSL, and the bit lines BL may be connected with another semiconductor die through pads PADs. For example, all or a part of the string selection lines SSL, the word lines WL, the ground selection lines GSL, and the bit lines BL may be connected through switches or may be connected directly to the pads PADs as described with reference to FIGS. 3 and 5 to 8.

In the case where a semiconductor die including the memory cell array 100 described with reference to FIGS. 18 and 19 and a semiconductor die including the peripheral device 200 described with reference to FIG. 20 are coupled, a nonvolatile memory device (e.g., a three-dimensional NAND flash memory device) may be implemented.

Signal lines of the first channel CH1 and the second channel CH2 may be connected to pads for communicating with an external host device (e.g., a controller to control a nonvolatile memory device). In the case where a controller is connected to a nonvolatile memory device where the first die DIE1 and the second die DIE2 are coupled, a storage device such as a memory card or a solid state drive may be implemented.

Figure 21:
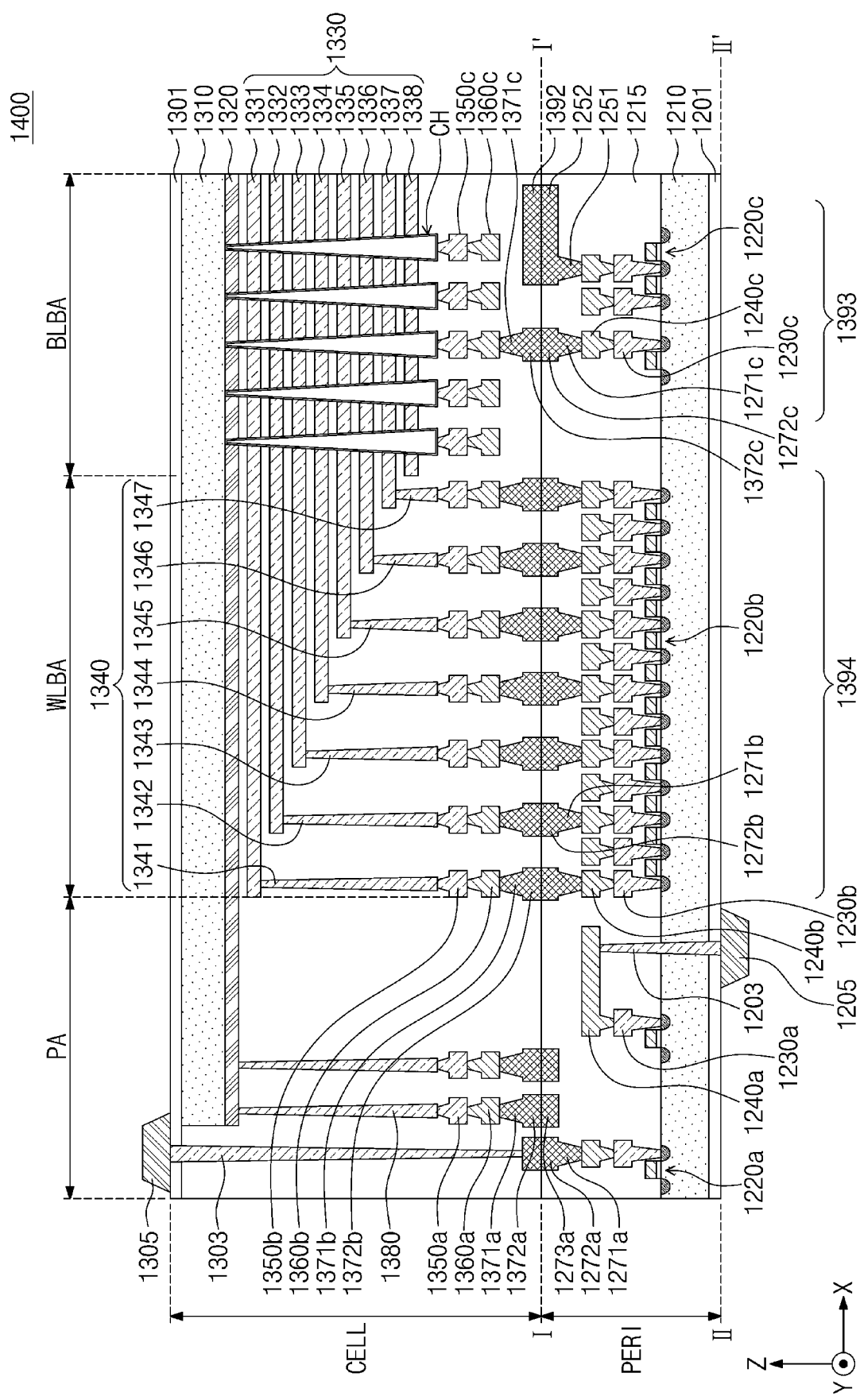
FIG. 21 is a diagram illustrating an exemplary nonvolatile memory device

FIG. 21 is a diagram illustrating an exemplary nonvolatile memory device 1400. Referring to FIG. 21, The X-direction may correspond to the 1st direction of the first and/or second internal circuits IC1/IC2. The Y-direction may correspond to the second direction of the first and/or the second internal circuits IC1/IC2. The Z-direction may corresponds to an opposite direction of the third direction of the first internal circuit, the third direction of the first internal circuit IC1, the third direction of the second internal circuit IC2, and/or an opposite direction of the third direction of the second internal circuit IC2.

The nonvolatile memory device 1400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten. Each of the peripheral circuit region PERI and the cell region CELL of the memory device 1400 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220*a*, 1220*b*, and 1220*c* formed on the first substrate 1210, first metal layers 1230*a*, 1230*b*, and 1230*c* respectively connected to the plurality of circuit elements 1220*a*, 1220*b*, and 1220*c*, and second metal layers 1240*a*, 1240*b*, and 1240*c* formed on the first metal layers 1230*a*, 1230*b*, and 1230*c*. In an example embodiment, the first metal layers 1230*a*, 1230*b*, and 1230*c* may be formed of tungsten having relatively high resistance, and the second metal layers 1240*a*, 1240*b*, and 1240*c* may be formed of copper having relatively low resistance.

In an example embodiment illustrate in FIG. 21, although the first metal layers 1230*a*, 1230*b*, and 1230*c* and the second metal layers 1240*a*, 1240*b*, and 1240*c* are shown and described, they are not limited thereto, and one or more metal layers may be further formed on the second metal layers 1240*a*, 1240*b*, and 1240*c*. At least a portion of the one or more metal layers formed on the second metal layers 1240*a*, 1240*b*, and 1240*c* may be formed of aluminum or the like having a lower resistance than those of copper forming the second metal layers 1240*a*, 1240*b*, and 1240*c*.

The interlayer insulating layer 1215 may be disposed on the first substrate 1210 and cover the plurality of circuit elements 1220*a*, 1220*b*, and 1220*c*, the first metal layers 1230*a*, 1230*b*, and 1230*c*, and the second metal layers 1240*a*, 1240*b*, and 1240*c*. The interlayer insulating layer 1215 may include an insulating material such as silicon oxide, silicon nitride, or the like.

Lower bonding metals 1271*b* and 1272*b* may be formed on the second metal layer 1240*b* in the word line bonding area WLBA. In the word line bonding area WLBA, the lower bonding metals 1271*b* and 1272*b* in the peripheral circuit region PERI may be electrically connected to upper bonding metals 1371*b* and 1372*b* in the cell region CELL in a bonding manner, and the lower bonding metals 1271*b* and 1272*b* and the upper bonding metals 1371*b* and 1372*b* may be formed of aluminum, copper, tungsten, or the like.

Further, the upper bonding metals 1371*b* and 1372*b* in the cell region CELL may be referred as first metal pads and the lower bonding metals 1271*b* and 1272*b* in the peripheral circuit region PERI may be referred as second metal pads.

The cell region CELL may include at least one memory block. The cell region CELL may include a second substrate 1310 and a common source line 1320. On the second substrate 1310, a plurality of word lines 1331 to 1338 (i.e., 1330) may be stacked in a direction (a Z-axis direction), perpendicular to an upper surface of the second substrate 1310. At least one string select line and at least one ground select line may be arranged on and below the plurality of word lines 1330, respectively, and the plurality of word lines 1330 may be disposed between the at least one string select line and the at least one ground select line.

In the bit line bonding area BLBA, a channel structure CH may extend in a direction, perpendicular to the upper surface of the second substrate 1310, and pass through the plurality of word lines 1330, the at least one string select line, and the at least one ground select line. The channel structure CH may include a data storage layer, a channel layer, a buried insulating layer, and the like, and the channel layer may be electrically connected to a first metal layer 1350*c* and a second metal layer 1360*c*. For example, the first metal layer 1350*c* may be a bit line contact, and the second metal layer 1360*c* may be a bit line. In an example embodiment, the bit line 1360*c* may extend in a first direction (a Y-axis direction), parallel to the upper surface of the second substrate 1310.

In an example embodiment illustrated in FIG. 21, an area in which the channel structure CH, the bit line 1360*c*, and the like are disposed may be defined as the bit line bonding area BLBA. In the bit line bonding area BLBA, the bit line 1360*c* may be electrically connected to the circuit elements 1220*c* providing a page buffer 1393 in the peripheral circuit region PERI. For example, the bit line 1360*c* may be connected to upper bonding metals 1371*c* and 1372*c* in the cell region CELL, and the upper bonding metals 1371*c* and 1372*c* may be connected to lower bonding metals 1271*c* and 1272*c* connected to the circuit elements 1220*c* of the page buffer 1393.

In the word line bonding area WLBA, the plurality of word lines 1330 may extend in a second direction (an X-axis direction), parallel to the upper surface of the second substrate 1310, and may be connected to a plurality of cell contact plugs 1341 to 1347 (i.e., 1340). The plurality of word lines 1330 and the plurality of cell contact plugs 1340 may be connected to each other in pads provided by at least a portion of the plurality of word lines 1330 extending in different lengths in the second direction. A first metal layer 1350*b* and a second metal layer 1360*b* may be connected to an upper portion of the plurality of cell contact plugs 1340 connected to the plurality of word lines 1330, sequentially. The plurality of cell contact plugs 1340 may be connected to the circuit region PERI by the upper bonding metals 1371*b* and 1372*b* of the cell region CELL and the lower bonding metals 1271*b* and 1272*b* of the peripheral circuit region PERI in the word line bonding area WLBA.

The plurality of cell contact plugs 1340 may be electrically connected to the circuit elements 1220*b* providing a row decoder 1394 in the peripheral circuit region PERI. In an example embodiment, operating voltages of the circuit elements 1220*b* providing the row decoder 1394 may be different than operating voltages of the circuit elements 1220*c* providing the page buffer 1393. For example, operating voltages of the circuit elements 1220*c* providing the page buffer 1393 may be greater than operating voltages of the circuit elements 1220*b* providing the row decoder 1394.

A common source line contact plug 1380 may be disposed in the external pad bonding area PA. The common source line contact plug 1380 may be formed of a conductive material such as a metal, a metal compound, polysilicon, or the like, and may be electrically connected to the common source line 1320. A first metal layer 1350*a* and a second metal layer 1360*a* may be stacked on an upper portion of the common source line contact plug 1380, sequentially. For example, an area in which the common source line contact plug 1380, the first metal layer 1350*a*, and the second metal layer 1360*a* are disposed may be defined as the external pad bonding area PA.

Input-output pads 1205 and 1305 may be disposed in the external pad bonding area PA. Referring to FIG. 21, a lower insulating film 1201 covering a lower surface of the first substrate 1210 may be formed below the first substrate 1210, and a first input-output pad 1205 may be formed on the lower insulating film 1201. The first input-output pad 1205 may be connected to at least one of the plurality of circuit elements 1220*a*, 1220*b*, and 1220*c* disposed in the peripheral circuit region PERI through a first input-output contact plug 1203, and may be separated from the first substrate 1210 by the lower insulating film 1201. In addition, a side insulating film may be disposed between the first input-output contact plug 1203 and the first substrate 1210 to electrically separate the first input-output contact plug 1203 and the first substrate 1210.

Referring to FIG. 21, an upper insulating film 1301 covering the upper surface of the second substrate 1310 may be formed on the second substrate 1310, and a second input-output pad 1305 may be disposed on the upper insulating layer 1301. The second input-output pad 1305 may be connected to at least one of the plurality of circuit elements 1220*a*, 1220*b*, and 1220*c* disposed in the peripheral circuit region PERI through a second input-output contact plug 1303.

According to embodiments, the second substrate 1310 and the common source line 1320 may not be disposed in an area in which the second input-output contact plug 1303 is disposed. Also, the second input-output pad 1305 may not overlap the word lines 1330 in the third direction (the Z-axis direction). Referring to FIG. 21, the second input-output contact plug 1303 may be separated from the second substrate 1310 in a direction, parallel to the upper surface of the second substrate 1310, and may pass through the interlayer insulating layer 1315 of the cell region CELL to be connected to the second input-output pad 1305 and the lower bonding metals 1271*a* and 1272*a* of the peripheral circuit area PERI.

According to embodiments, the first input-output pad 1205 and the second input-output pad 1305 may be selectively formed. For example, the memory device 1400 may include only the first input-output pad 1205 disposed on the first substrate 1210 or the second input-output pad 1305 disposed on the second substrate 1310. Alternatively, the memory device 1400 may include both the first input-output pad 1205 and the second input-output pad 1305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1400 may include a lower metal pattern 1273*a*, corresponding to an upper metal pattern 1372*a* formed in an uppermost metal layer of the cell region CELL, and having the same shape as the upper metal pattern 1372*a* of the cell region CELL, in an uppermost metal layer of the peripheral circuit region PERI. In the peripheral circuit region PERI, the lower metal pattern 1273*a* formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 1271*b* and 1272*b* may be formed on the second metal layer 1240*b* in the word line bonding area WLBA. In the word line bonding area WLBA, the lower bonding metals 1271*b* and 1272*b* of the peripheral circuit region PERI may be electrically connected to the upper bonding metals 1371*b* and 1372*b* of the cell region CELL by a Cu—Cu bonding.

Further, the bit line bonding area BLBA, an upper metal pattern 1392, corresponding to a lower metal pattern 1252 formed in the uppermost metal layer of the peripheral circuit region PERI, and having the same shape as the lower metal pattern 1252 of the peripheral circuit region PERI, may be formed in an uppermost metal layer of the cell region CELL. A contact may not be formed on the upper metal pattern 1392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

The cell region CELL of the nonvolatile memory device 1400 may comprise the memory cell array 100, the string selection lines SSL, the word lines WL, the ground selection lines GSL, and the pads PADs. The plurality of word lines 330 may correspond to the word lines WL of FIG. 18. A part of the plurality of word lines 330 may be manufactured differently from others of the plurality of word lines 330 and used as the string selection lines SSL and ground selection lines GSL as shown in FIG. 19. The upper bonding metals 371*b*, 372*b* may correspond to pads, among the pads PADs of FIG. 18, connected to the string selection lines SSL, the word lines WL and the ground selection lines GSL. The upper bonding metals 371*c* and 372*c* may correspond to pads, among the pads PADs of FIG. 18, connected to bit lines BL.

The peripheral circuit region PERI of the nonvolatile memory device may comprise the peripheral device 200. The lower bonding metals 271*b*, 272*b* may correspond to pads, among the pads PADs of FIG. 20, connected to the string selection lines SSL, the word lines WL and the ground selection lines GSL. The lower bonding metals 271*c* and 272*c* may correspond to pads, among the pads PADs of FIG. 20, connected to bit lines BL. The input-output pads 205 and 305 may carry the address ADDR, the command CMD, the data DATA, and the control signal CTRL.

In the above-described embodiments, components of semiconductor wafers and semiconductor dies are described by using the terms "first", "second", "third", and the like. However, the terms "first", "second", "third", and the like may be used to distinguish components from each other and do not limit the inventive concept. For example, the terms "first", "second", "third", and the like do not involve an order or a numerical meaning of any form.

In the above embodiments, components according to embodiments of the inventive concept are described by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to the inventive concept, semiconductor dies and semiconductor wafers include pads supporting alignment upon coupling. Accordingly, semiconductor dies and semiconductor wafers provided herein support coupling of the semiconductor dies and/or semiconductor wafers to be performed easily.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A nonvolatile memory device comprising:
a memory cell region including first metal pads; and
a peripheral circuit region including second metal pads,
wherein each of the memory cell region and/or the peripheral circuit region comprises:
switches electrically connected with corresponding ones of the first metal pads and/or the second metal pads, respectively;
a test signal generator configured to generate test signals and to transmit the test signals to the switches;
internal circuits configured to receive first signals through the corresponding ones of the first metal pads and/or second metal pads and the switches, to perform operations based on the first signals, and to output second signals through the switches and the corresponding ones of the first metal pads and/or second metal pads based on a result of the operations; and
a switch controller configured to control the switches so that the corresponding ones of the first metal pads and/or the second metal pads communicate with the test signal generator during a test operation and that the corresponding ones of the first metal pads and/or the second metal pads communicate with the internal circuits after a completion of the test operation,
wherein the peripheral circuit region is vertically connected to the memory cell region by the first metal pads and the second metal pads directly.

2. The semiconductor die of claim 1, wherein the first metal pads and the second metal pads are formed of copper.

3. The semiconductor die of claim 1, wherein each of the memory cell region and/or the peripheral circuit region further comprises:
a third pad electrically connected with the test signal generator,
wherein the test signal generator is configured to transmit the test signals depending on a test command received through the third pad.

4. The semiconductor die of claim 1, wherein the first metal pads and the second metal pads are connected by bonding manner.

5. The semiconductor die of claim 1, wherein the switch controller includes a laser fuse,
wherein, when the laser fuse is in a connected state, the switch controller controls the switches such that the test signal generator and the corresponding ones of the first metal pads and/or the second metal pads communicate with each other; and
wherein, when the laser fuse is in a disconnected state, the switch controller controls the switches such that the internal circuits and the corresponding ones of the first metal pads and/or the second metal pads communicate with each other.

6. The semiconductor die of claim 1, wherein the switch controller includes an electrical fuse,
wherein, when the electrical fuse is in a first state, the switch controller controls the switches such that the test signal generator and the corresponding ones of the first metal pads and/or the second metal pads communicate with each other; and
wherein, when the electrical fuse is in a second state, the switch controller controls the switches such that the internal circuits and the corresponding ones of the first metal pads and/or the second metal pads communicate with each other.

7. The semiconductor die of claim 1, wherein the memory cell region is formed on a first wafer and the peripheral circuit region is formed on a second wafer.

8. The semiconductor die of claim 1, wherein the corresponding ones of the first metal pads and/or the second metal pads are disposed in line along a first direction, and intervals between the corresponding ones of the first metal pads and/or the second metal pads gradually increase or decrease in the first direction.

9. The semiconductor die of claim 1, wherein an interval between at least two pads from among the first metal pads and/or the second metal pads is smaller than a width of each of the at least two pads.

10. The semiconductor die of claim 1, wherein the internal circuits of the memory cell region include memory cells electrically connected with string selection lines, word lines, ground selection lines, and bit lines, and
wherein at least some of the string selection lines, the word lines, the ground selection lines, and the bit lines are electrically connected with the first metal pads through the switches.

11. The semiconductor die of claim 1, wherein the peripheral circuit region further comprises:
third pads and fourth pads configured to communicate with an external device, and
wherein the internal circuits of the peripheral circuit region include:
a buffer circuit configured to receive a row address, a column address and a command from the external device through the third pads and to exchange read data or write data with the external device through the third pads;
a row decoder circuit electrically connected with string selection lines, word lines, and ground selection lines through a part of the second metal pads and a part of the first metal pads, and configured to receive the row address from the buffer block and to adjust voltages of the string selection lines, the word lines, and the ground selection lines based on the row address;
a page buffer circuit electrically connected with bit lines through another part of the second metal pads and another part of the first metal pads, and configured to adjust voltages of the bit lines based on the write data stored therein in a write operation and to store the voltages of the bit lines therein as the read data in a read operation;
a data input and output circuit electrically connected between the page buffer circuit and the buffer circuit, and configured to receive the column address from the buffer circuit and to exchange the write data and the read data between the page buffer circuit and the buffer circuit based on the column address; and a control logic circuit configured to receive a control signal from the external device through the fourth pads, to receive the command from the buffer block, and to control the write operation and the read operation based on the command and the control signal.

12. A nonvolatile memory device comprising:
a memory cell region including first metal pads; and
a peripheral circuit region including second metal pads,
wherein each of the memory cell region and/or the peripheral circuit region comprises:
  switches electrically connected with the corresponding ones of the first metal pads and/or the second metal pads;
  a test signal receiver configured to receive reception signals through the first pads and the switches;
  internal circuits configured to receive first signals through the corresponding ones of the first metal pads and/or the second metal pads and the switches, to perform operations based on the first signals, and to output second signals through the switches and the corresponding ones of the first metal pads and/or the second metal pads based on a result of the operations; and
  a switch controller configured to control the switches so that the corresponding ones of the first metal pads and/or the second metal pads communicate with the test signal receiver during a test operation and that the corresponding ones of the first metal pads and/or the second metal pads to the internal circuits after a completion of the test operation,
wherein the peripheral circuit region is vertically connected to the memory cell region by the first metal pads and the second metal pads directly.

13. The semiconductor die of claim 12, further comprising:
a third pad electrically connected with the test signal receiver,
wherein the reception signals vary depending on a test command received through the third pad.

14. The semiconductor die of claim 12, further comprising:
a third pad configured to be used for the test signal receiver to output a result of the test operation to an external device after the reception signals are received.

15. The semiconductor die of claim 12, wherein the first metal pads and/or the second metal pads are disposed in line along a first direction, and intervals between the first metal pads and/or the second metal pads gradually increase or decrease in the first direction.

16. A nonvolatile memory wafer comprising:
first pads disposed in line along a first direction, wherein intervals between the first pads gradually increase or decrease in the first direction;
test signal devices electrically connected with at least a part of the first pads, and configured to transmit or receive test signals through the at least the part of the first pads; and
internal circuits, each of the internal circuits being one of a nonvolatile memory cell region or a peripheral circuit region configured to access the nonvolatile memory cell region,
wherein the peripheral circuit region is configured to be vertically connected to the memory cell region by at least another part of the first pads directly.

17. The semiconductor wafer of claim 16, further comprising:
second pads disposed in line along a second direction crossing the first direction,
wherein intervals between the second pads gradually increase or decrease in the second direction, and
wherein the second pads are electrically connected with the test signal devices to transmit or receive the test signals.

18. The semiconductor wafer of claim 16, further comprising:
switches configured to control so that the at least the another part of the first pads communicate with the test signal devices in a test operation and the at least the another part of the first pads communicate with the internal circuits after a completion of the test operation.

19. The semiconductor wafer of claim 16, wherein the semiconductor wafer comprises a plurality of semiconductor dies configured to be divided into separate semiconductor dies, and
wherein the at least the part of the first pads and the test signal devices are disposed on a cutting line disposed between the semiconductor dies.

20. The semiconductor wafer of claim 16, further comprising:
second pads disposed in line along the first direction at regular intervals.

* * * * *